US012738312B2

(12) United States Patent
Park et al.

(10) Patent No.: US 12,738,312 B2
(45) Date of Patent: Sep. 15, 2026

(54) MEMORY DEVICE WITH ROW DECODER HAVING MAIN WORD LINER DRIVER AND SUB WORD LINE DRIVER

(71) Applicant: SAMSUNG ELECTRONICS CO., LTD., Suwon-si (KR)

(72) Inventors: Keonwoo Park, Suwon-si (KR); Kyuchang Kang, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 75 days.

(21) Appl. No.: 18/674,301

(22) Filed: May 24, 2024

(65) Prior Publication Data

US 2024/0420755 A1 Dec. 19, 2024

(30) Foreign Application Priority Data

Jun. 16, 2023 (KR) ........................ 10-2023-0077456

(51) Int. Cl.
*G11C 11/408* (2006.01)

(52) U.S. Cl.
CPC ...... *G11C 11/4085* (2013.01); *G11C 11/4087* (2013.01)

(58) Field of Classification Search
CPC ............ G11C 11/4085; G11C 11/4087; G11C 11/4097; G11C 5/063; G11C 5/066; H10B 12/482; H10B 12/488; H10B 12/50; H10B 41/40; H10B 41/27; H10B 43/27; H10B 43/40
See application file for complete search history.

(56) References Cited

U.S. PATENT DOCUMENTS 6,118,722 A 9/2000 Jeon et al.
10,872,654 B1 12/2020 Lee
10,896,706 B2 1/2021 Ingalls et al.
11,238,919 B2 2/2022 Wada
11,423,972 B2 8/2022 Li et al.
11,568,902 B2 1/2023 Koyama et al.
2003/0103368 A1* 6/2003 Arimoto .............. G11C 29/028 365/230.06
2014/0192598 A1* 7/2014 He ..................... G11C 16/0483 365/185.17
2022/0108985 A1 4/2022 Nagatsuka et al.
2023/0333742 A1* 10/2023 English ................. G11C 11/418

FOREIGN PATENT DOCUMENTS

KR 10-0205007 B1 6/1999
KR 10-0228769 B1 11/1999

* cited by examiner

*Primary Examiner* — Sultana Begum
(74) *Attorney, Agent, or Firm* — Sughrue Mion, PLLC

(57) ABSTRACT

A memory device having a row decoder circuit architecture is provided. The memory device includes a peripheral circuit structure and a cell array structure provided on the peripheral circuit structure and vertically overlapping the peripheral circuit structure. The cell array structure may include a plurality of memory blocks including a plurality of vertical channel transistor structures and a plurality of capacitor structures respectively connected to the vertical channel transistor structures. The peripheral circuit structure includes a row decoder connected to a plurality of word lines of the plurality of memory blocks, and the row decoder includes a first circuit group commonly connected to the plurality of memory blocks and a second circuit group connected to each of the plurality of memory blocks.

18 Claims, 28 Drawing Sheets

200
BLB
EQ
N13
N14
VEQ
PEQ
N15
NSA
N11
N12
LAB
SA
PSA
P11
P12
LA
BL
200
WL
CT
CC
MC

MEMORY DEVICE WITH ROW DECODER HAVING MAIN WORD LINER DRIVER AND SUB WORD LINE DRIVER

CROSS-REFERENCE TO RELATED APPLICATION

This application is based on and claims priority under 35 U.S.C. § 119 to Korean Patent Application No. 10-2023-0077456, filed on Jun. 16, 2023, in the Korean Intellectual Property Office, the disclosure of which is incorporated by reference herein in its entirety.

BACKGROUND

Apparatuses and methods consistent with embodiments of the present disclosure relate to a semiconductor device, and more particularly, to a memory device having a row decoder architecture for reducing sizes of chips of the memory device.

In some examples, memory devices may have larger capacity and higher integration. As the size of a memory cell is reduced to facilitate a high integration, operational circuits and/or wiring structures within a memory device for operation and electrical connection of the memory device may become more complex. Therefore, there is a demand for a memory device having improved electrical characteristics with improved integration. To improve storage capacity and integration of a memory device, instead of relying on planar channel transistors formed on a semiconductor substrate, vertical channel transistors are being introduced, which are formed vertically on a semiconductor substrate.

A memory device, e.g., dynamic random access memory (DRAM), includes a plurality of memory cells including a vertical channel transistor and a capacitor. The memory device operates by reading and writing data through the use of electric charges stored in the capacitor. Memory cells are connected to word lines and bit lines. In DRAM, during a read operation or a refresh operation a row decoder decodes a given row address to select a word line corresponding to the row address and applies a word line driving voltage of a high voltage VPP to the selected word line. Additionally, sense amplifiers may sense voltage levels of bit lines corresponding to a column address from among bit lines of memory cells connected to the selected word line.

The DRAM may have a cell over periphery (COP) structure including a cell array structure and a peripheral circuit structure overlapping each other in a vertical direction. The cell array structure may include a memory cell array including a plurality of memory cells including vertical channel transistors and capacitors, and the peripheral circuit structure may include peripheral circuits including a row decoder and a sense amplifier. As memory processes continues to shrink, the proportion of the area occupied by a peripheral circuit region increases with respect to the area occupied by a memory cell array region.

SUMMARY

One or more example embodiments provide a memory device having a row decoder circuit architecture associated with a plurality of memory cells including vertical channel transistors and reducing the chip size of the memory device.

According to an aspect of the present disclosure, a memory device may include: a peripheral circuit structure; and a cell array structure provided on the peripheral circuit structure and overlapping the peripheral circuit structure in a vertical direction, wherein the cell array structure may include a plurality of memory blocks arranged in a first horizontal direction, each of the plurality of memory blocks including: a memory cell region including a plurality of word lines each of which extends in the first horizontal direction and a plurality of bit lines each of which extends in a second horizontal direction perpendicular to the first horizontal direction, wherein the peripheral circuit structure may include a row decoder connected to the plurality of word lines of each of the plurality of memory blocks, and the row decoder may include: a first circuit group configured to generate main word line driving signals and sub word line driving signals, the first circuit group being commonly connected to the plurality of memory blocks and a second circuit group configured to generate local main word line driving signals and local sub word line driving signals connected to each of the plurality of memory blocks and activate one word line from among the plurality of word lines of a memory block selected from among the plurality of memory blocks.

According to another aspect of the present disclosure, a memory device may include: a peripheral circuit structure; and a cell array structure provided on the peripheral circuit structure and overlapping the peripheral circuit structure in a vertical direction, wherein the cell array structure may include a plurality of memory blocks arranged in a first horizontal direction, each of the plurality of memory blocks including: a memory cell region including a plurality of word lines each of which extends in the first horizontal direction and a plurality of bit lines each of which extends in a second horizontal direction perpendicular to the first horizontal direction, wherein the peripheral circuit structure may include a row decoder connected to even word lines and odd word lines of the plurality of word lines of each of the plurality of memory blocks, and the row decoder including: a first circuit group configured to generate main word line driving signals, the first circuit group being commonly connected to the plurality of memory blocks and sub word line driving signals associated with the even word lines and the odd word lines based on row address signals; and a second circuit group configured to generate local main word line driving signals, the second circuit group being commonly connected to the plurality of memory blocks and local sub word line driving signals associated with the even word lines and the odd word lines based on the row address signals and activate one word line from among the even word lines and the odd word lines of a memory block selected from among the plurality of memory blocks.

According to another aspect of the present disclosure, there is provided a memory device including a memory cell array including a plurality of memory cells connected to a plurality of word lines, wherein the memory cell array includes a plurality of memory blocks, and a row decoder connected to the plurality of word lines of each of the plurality of memory blocks, wherein the row decoder includes a first circuit group configured to generate main word line driving signals and sub word line driving signals, the first circuit group being commonly connected to the plurality of memory blocks, based on row address signals, and a second circuit group configured to generate local main word line driving signals and local sub word line driving signals respectively connected to the plurality of memory blocks and activate one word line from among the plurality of word lines of a memory block selected from among the plurality of memory blocks.

BRIEF DESCRIPTION OF THE DRAWINGS

Embodiments of the present disclosure will be more clearly understood from the following detailed description taken in conjunction with the accompanying drawings in which:

FIG. 18 is a diagram for describing the sense amplifier according to embodiments;

DETAILED DESCRIPTION OF THE EMBODIMENTS

At least one example of DRAM may have a reduced area occupied by the peripheral circuit region. Particularly, the at least one example of DRAM may have a reduced area occupied by the peripheral circuit region based on a reduced area allocated to a row decoder.

Figure 1:
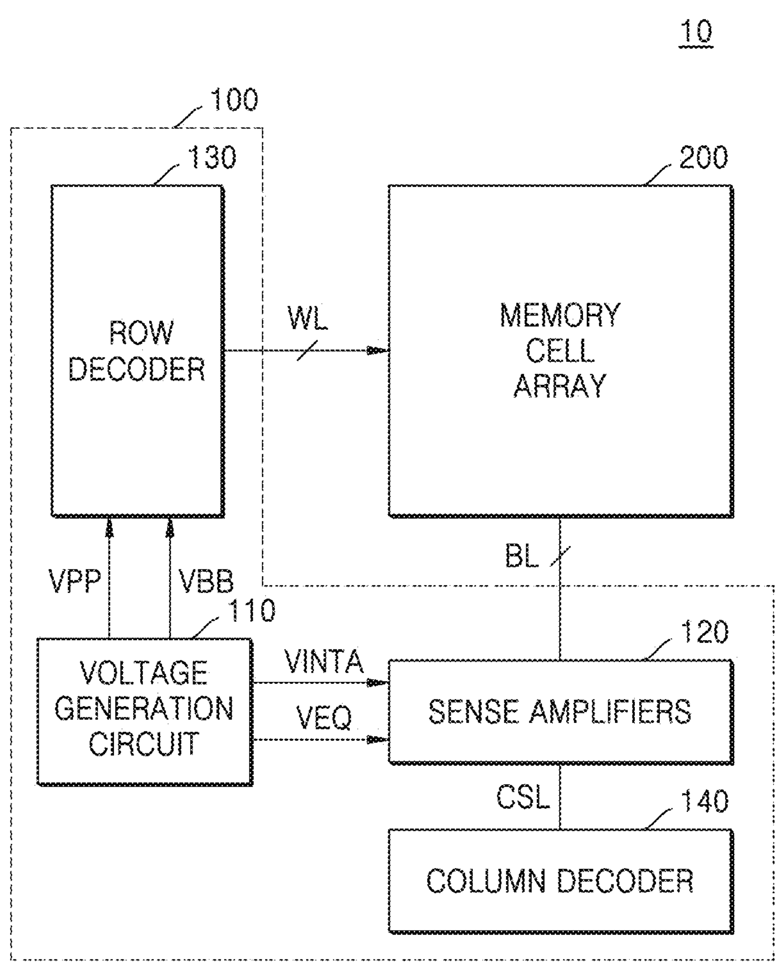
FIGS. 1 and 2 are diagrams for describing a memory device according to embodiments.
Figure 2:
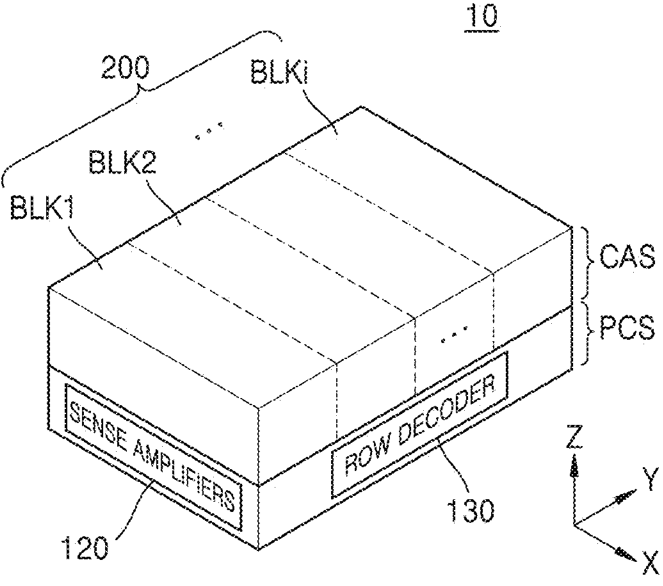

FIGS. 1 and 2 are diagrams for describing a memory device according to an embodiment. FIG. 2 is a diagram for describing a semiconductor structure of a memory device 10 of FIG. 1.

Referring to FIG. 1, the memory device 10 may include a peripheral circuit 100 and a memory cell array 200 which are connected to each other through a plurality of word lines WL and a plurality of bit lines BL. The peripheral circuit 100 may include a voltage generating circuit 110, a sense amplifier 120, a row decoder 130, and a column decoder 140. The peripheral circuit 100 may further include a control logic circuit, a data input/output circuit, a command decoder, a mode register, etc. According to embodiments, the memory device 10 may be dynamic random access memory (DRAM) including a plurality of memory cells, each including a vertical channel transistor and a capacitor. Hereinafter, a "memory device" will refer to DRAM.

Figure 18:
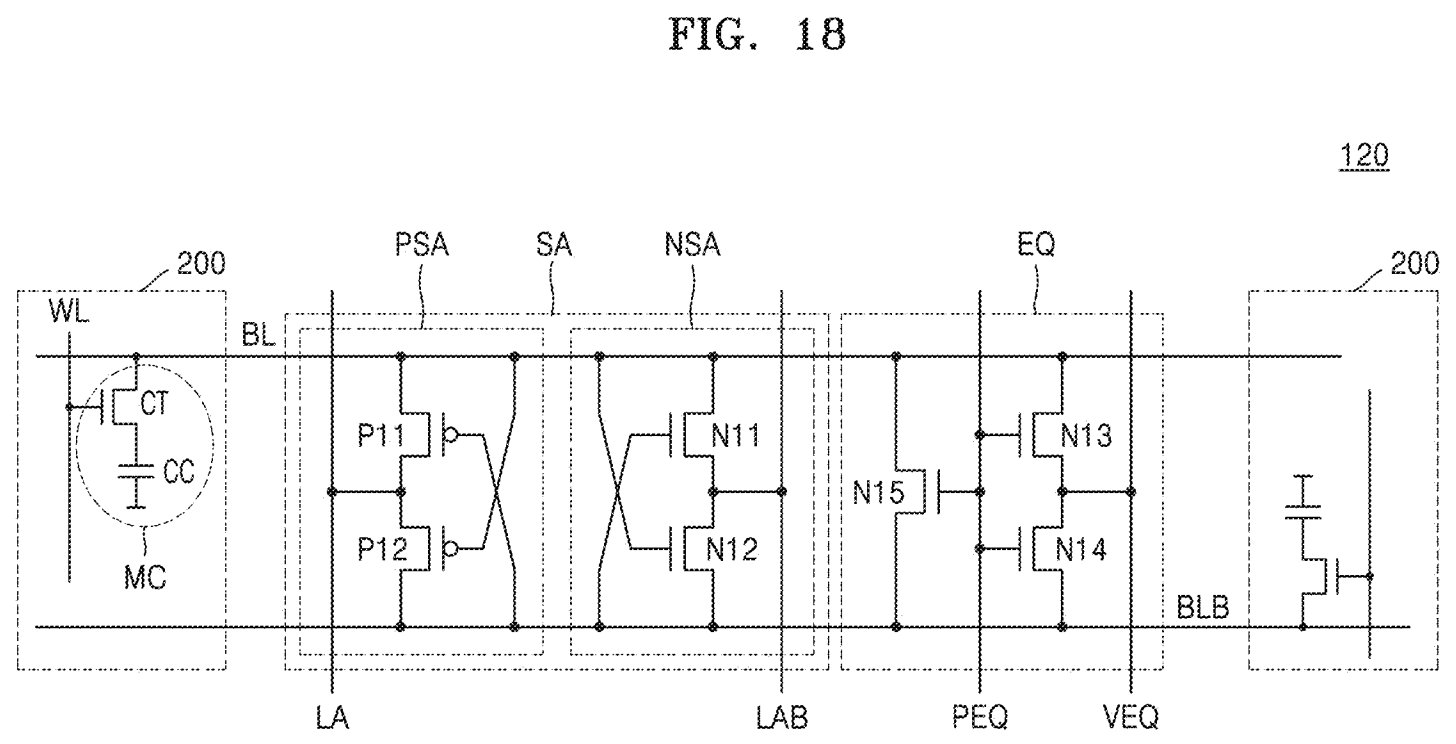

The memory cell array 200 may be connected to the row decoder 130 through word lines WL and connected to the sense amplifier 120 through bit lines BL. In the memory cell array 200, a plurality of memory blocks BLK1, BLK2, . . . , and BLKi (FIG. 2) (where "i" denotes a positive integer) may be DRAM memory cells. The memory cell array 200 includes a plurality of word lines WL and a plurality of bit lines BL connected to memory cells MC (FIG. 18). The memory cells MC may include a cell transistor CT and a cell capacitor CC. The cell transistor CT may be implemented as a cell structure CS described with reference to FIG. 19 and the cell capacitor CC may be implemented as a capacitor structure 1990. A gate of the cell transistor CT is connected to one of the plurality of word lines WL. One end of the cell transistor CT is connected to one of the plurality of bit lines BL. The cell capacitor CC may store charges of an amount corresponding to single bit data or multi bit data.

The voltage generating circuit 110 may generate various internal voltages for driving circuits of the memory device 10. The voltage generating circuit 110 may generate a high voltage VPP, a negative voltage VBB, an internal power voltage VINTA, and a bit line pre-charge voltage VEQ, a reference voltage, a bulk bias voltage, etc., by using a power voltage (e.g., VDD) applied from the outside of the memory device 10.

For example, the high voltage VPP that is higher than the power voltage VDD is provided to the row decoder 130, and may be used for word line driving circuits (FIGS. 4A and 5A) for turning on an N-type metal oxide semiconductor (NMOS) cell transistors connected to the word lines WL. The negative voltage VBB has a negative (−) voltage level lower than that of the power voltage VDD and may be used to increase the data retention time by raising a threshold voltage Vth of the NMOS cell transistor. The negative voltage VBB is applied to a well region where the NMOS cell transistor is formed and may be commonly referred to as a bulk bias voltage or a back bias voltage. The bit line pre-charge voltage VEQ may equalize a bit line BL and a complementary bit line BLB before the sense amplifier 120 (FIG. 18) generates a voltage difference between the bit line BL and the complementary bit line BLB. The internal power voltage VINTA may be provided to first and second sensing driving voltage lines LA and LAB of the sense amplifier 120. The sense amplifier 120 may sense and amplify a voltage difference between the bit line BL and the complementary bit line BLB according to the first and second sensing driving voltage lines LA and LAB. The reference voltage may be used to compare against the voltage of a signal received from a command/address bus to determine the logic value of the signal received from a memory controller.

The sense amplifier 120 may sense data stored in a memory cell MC and transmit sensed data to a data input/output circuit to output the sensed data to the outside of the memory device 10 through a data pad(s). The data input/output circuit may receive data to be written to the memory cells MC from the outside and transmit the data to the memory cell array 200. The data input/output circuit may output read data by using a data line amplifier that receives and amplifies data sensed by the sense amplifier 120. Read data may be output to the outside of the memory device 10 through the data pad(s).

The row decoder 130 may select at least one from among the plurality of memory blocks BLK1, BLK2, . . . , and BLKi by decoding a row address provided to the memory device 10 and select the word line WL of the selected memory block. The row decoder 130 may provide a high voltage VPP for performing a memory operation to the selected word line WL.

The column decoder 140 may decode a column address provided to the memory device 10 and provide a column select signal CSL for selecting bit lines BL corresponding to the column address. The bit lines BL selected by the column select signal CSL may be connected to the data input/output circuit.

Referring to FIG. 2, the memory device 10 may include a cell array structure CAS and a peripheral circuit structure PCS that overlap each other in the vertical direction (Z direction). The cell array structure CAS may include the memory cell array 200 of FIG. 1. The peripheral circuit structure PCS may include the peripheral circuit 100 of FIG. 1. For convenience of description, the row decoder 130 is shown in the peripheral circuit structure PCS. The row decoder 130 will be described later with reference to FIGS. 3 and 11.

The cell array structure CAS may include the plurality of memory blocks BLK1, BLK2, . . . , and BLKi (wherein " " denotes a positive integer). The plurality of memory blocks BLK1, BLK2, . . . , and BLKi may include a plurality of memory cells including vertical channel transistors and capacitors. The cell array structure CAS and the peripheral circuit structure PCS will be described later in detail with reference to FIG. 19.

Figure 3:
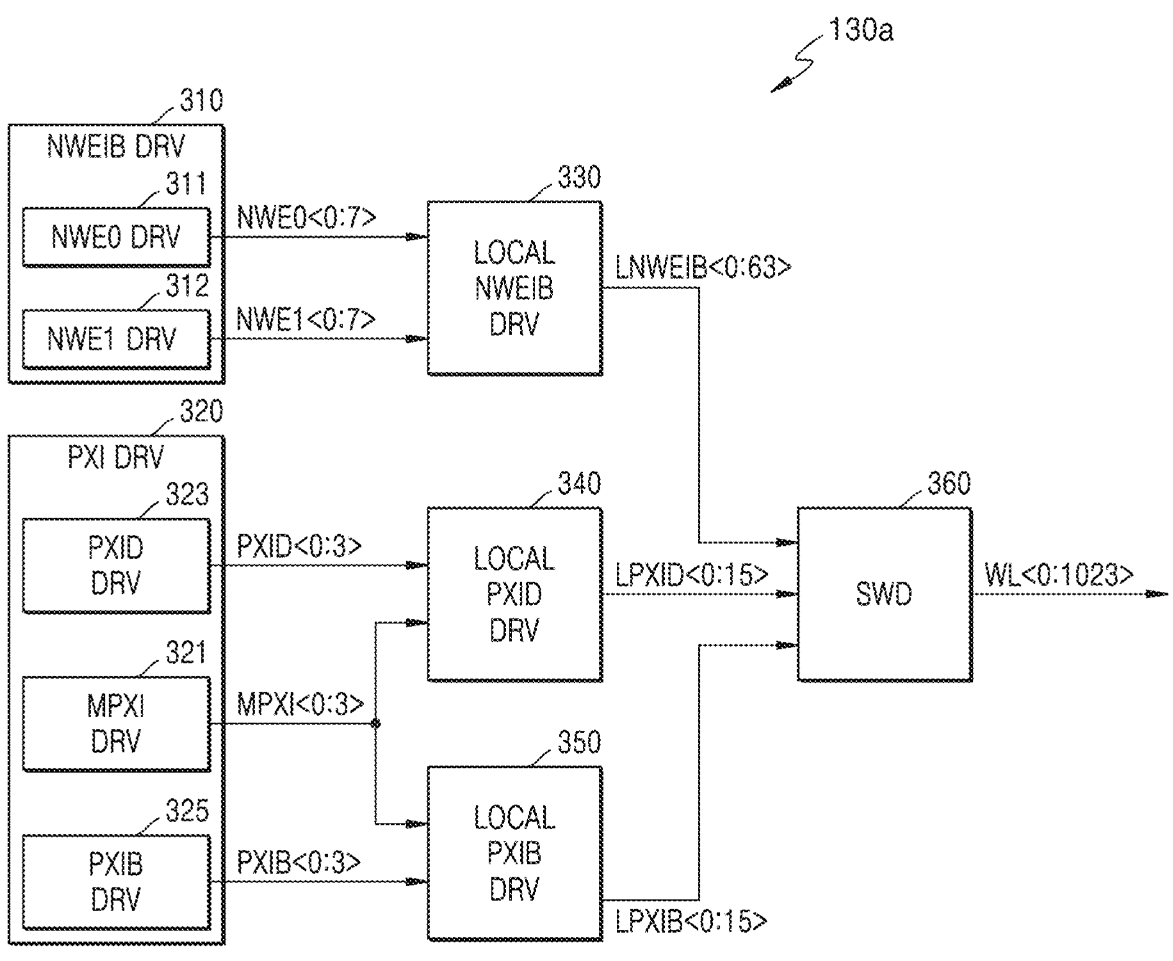
FIG. 3 is a block diagram for describing a row decoder according to embodiments.
Figure 4A:
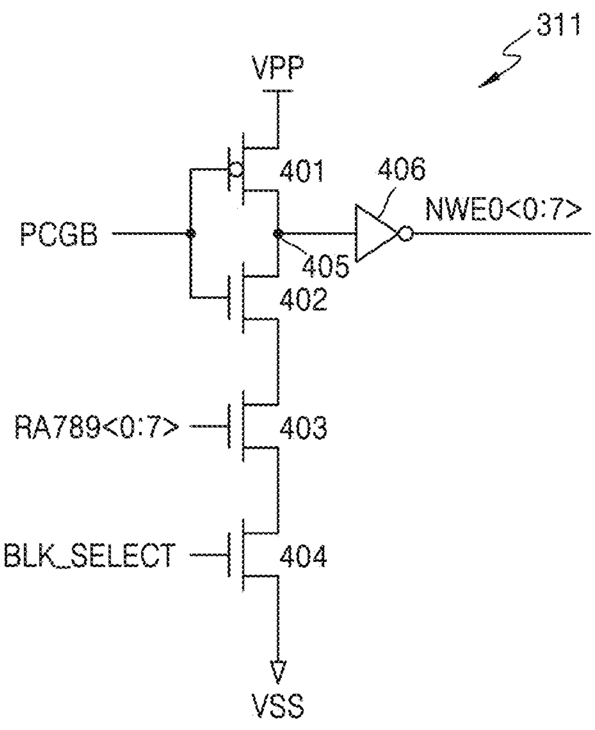
FIGS. 4A and 4B are circuit diagrams for describing a main word line driving signal generation circuit of FIG. 3.
Figure 4B:
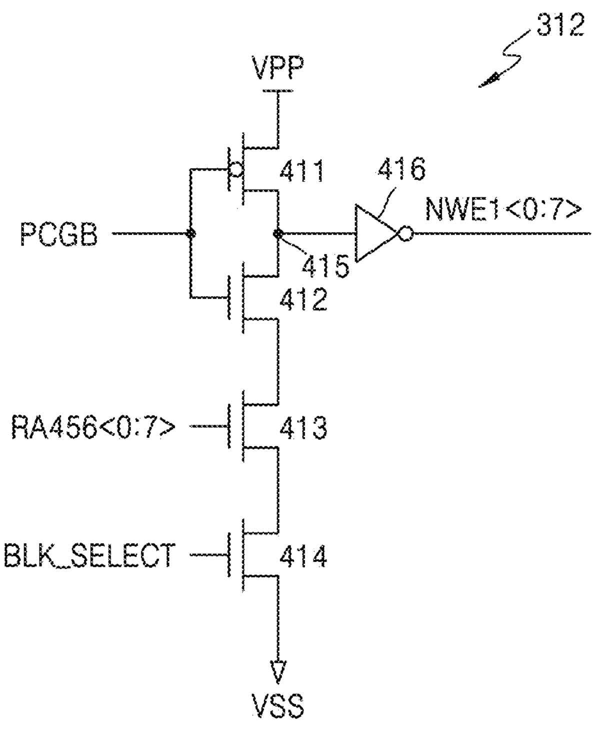
Figure 5A:
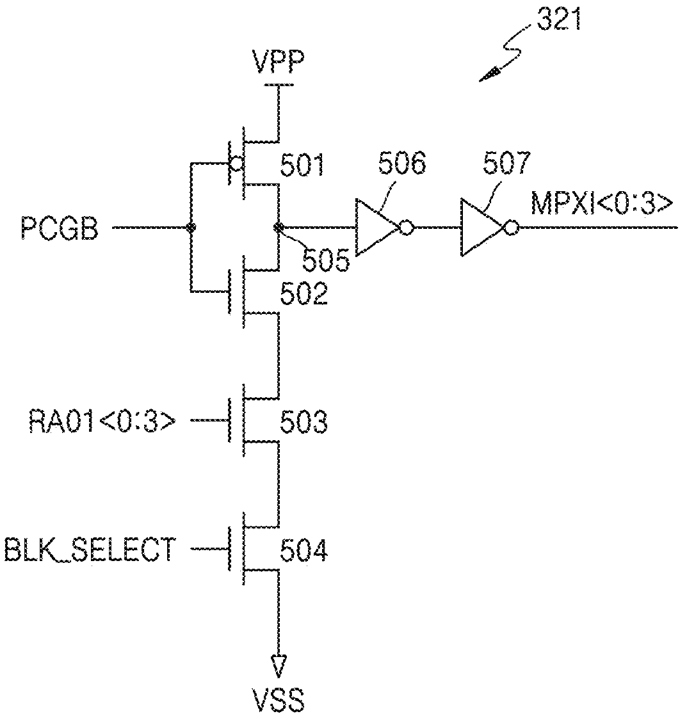
FIGS. 5A, 5B, and 5C are circuit diagrams for describing a sub word line driving signal generation circuit of FIG. 3.
Figure 5B:
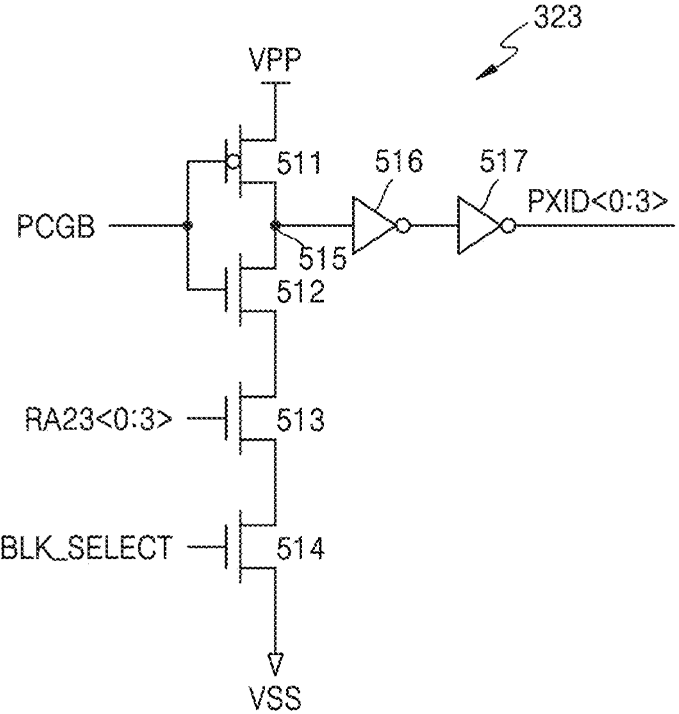
Figure 5C:
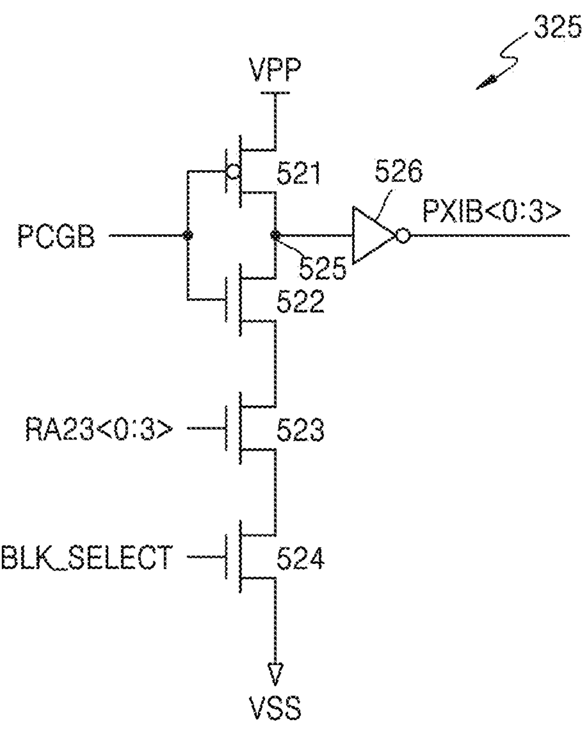
Figure 6:
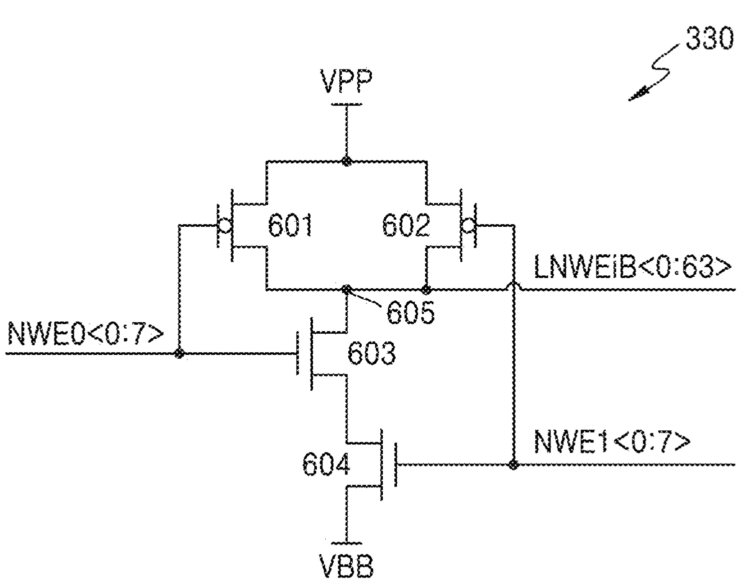
FIG. 6 is a circuit diagram for describing a local main word line driving signal generation circuit of FIG. 3.
Figure 7:
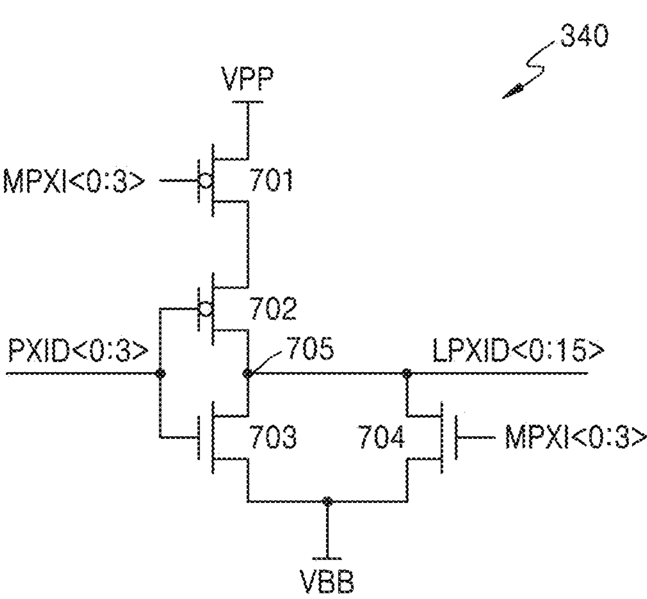
FIG. 7 is a circuit diagram for describing a first local sub word line driving signal generation circuit of FIG. 3.
Figure 8:
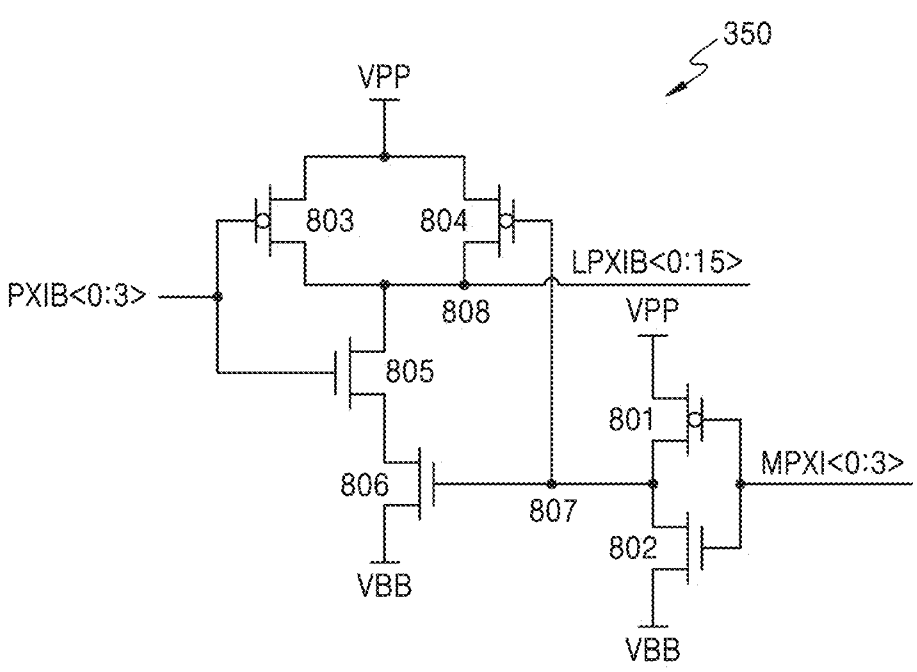
FIG. 8 is a circuit diagram for describing a second local sub word line driving signal generation circuit of FIG. 3.
Figure 9:
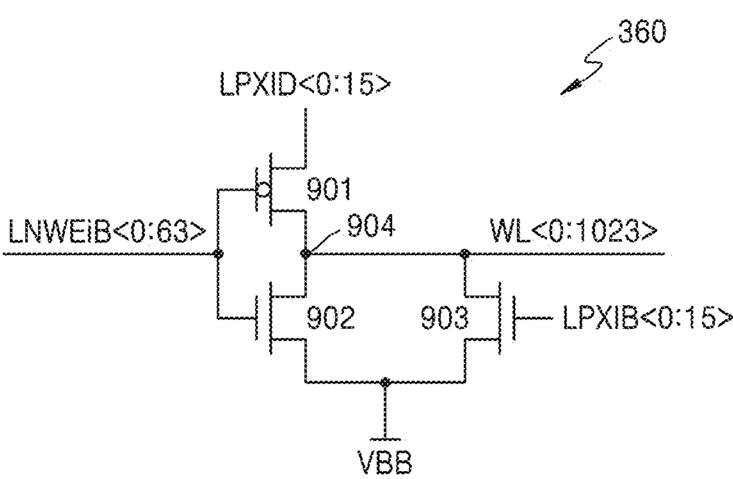
FIG. 9 is a circuit diagram for describing a sub word line driving circuit of FIG. 3.
Figure 10:
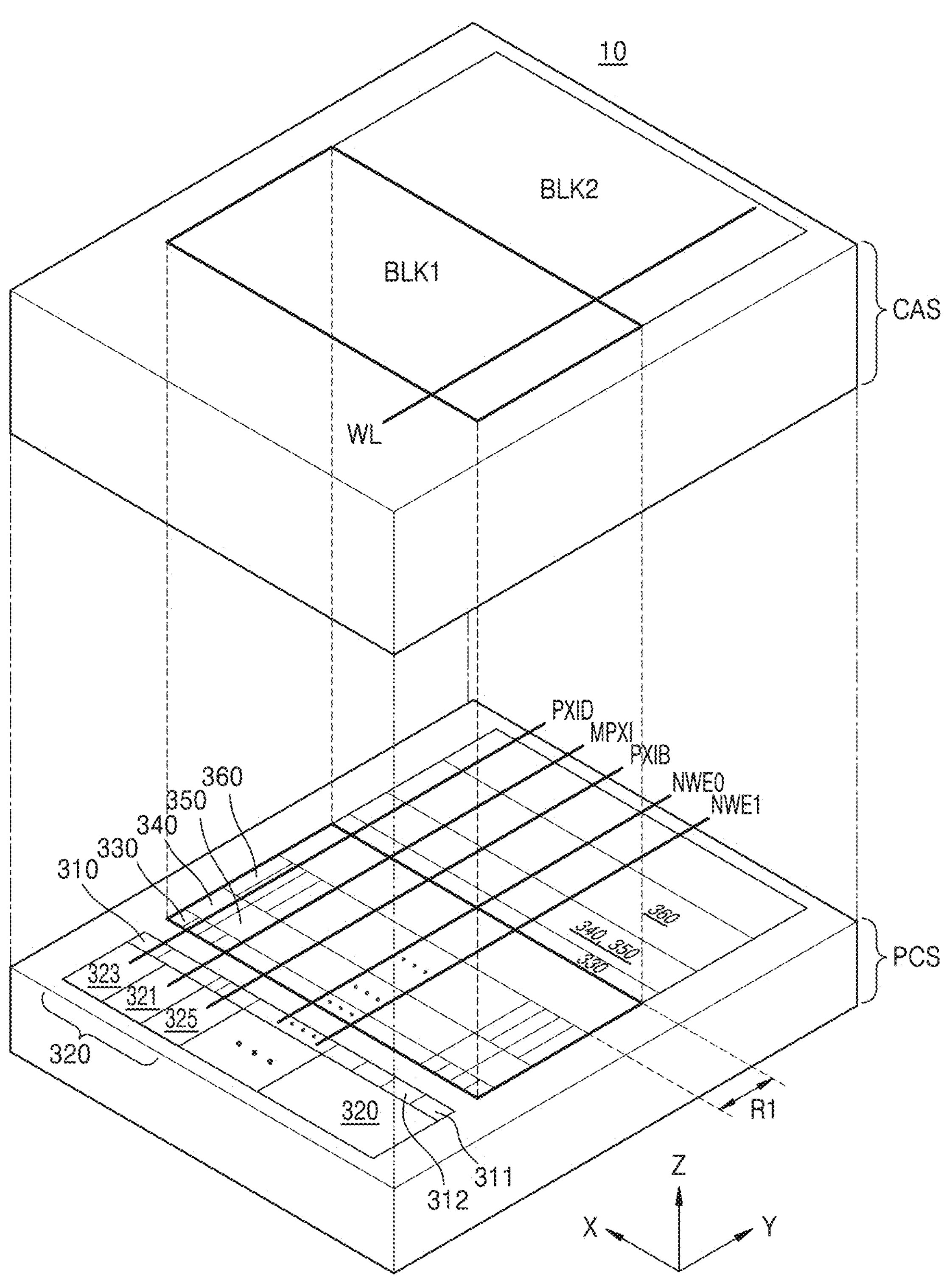
FIG. 10 is a diagram for describing a row decoder architecture in which a row decoder of FIG. 3 is disposed in a memory device.

FIGS. 3 to 10 are diagrams for describing a row decoder according to embodiments. FIG. 3 is a block diagram for describing a row decoder 130*a* which corresponds to the row decoder 130 shown in FIG. 1. FIGS. 4A and 4B are circuit diagrams for describing a main word line driving signal generation circuit 310 of FIG. 3. FIGS. 5A to 5C are circuit diagrams for describing a sub word line driving signal generation circuit 320 of FIG. 3. FIG. 6 is a circuit diagram for describing a local main word line driving signal generation circuit 330 of FIG. 3. FIG. 7 is a circuit diagram for describing a first local sub word line driving signal generation circuit 340 of FIG. 3. FIG. 8 is a circuit diagram for describing a second local sub word line driving signal generation circuit 350 of FIG. 3. FIG. 9 is a circuit diagram for describing a sub word line driving circuit 360 of FIG. 3. FIG. 10 is a diagram for describing a row decoder architecture in which the row decoder 130*a* of FIG. 3 is disposed in the memory device 10. Hereinafter, letters appended to reference numerals (e.g., "a" in 130*a*, "b" in 130*b*, etc.) are used to distinguish a plurality of circuits having the same or substantially the same function.

Referring to FIG. 3, the row decoder 130*a* may select the word line WL corresponding to a row address RA with respect to a memory block selected from among the plurality of memory blocks BLK1, BLK2, . . . , and BLKi of FIG. 2. In the below embodiments, for convenience of explanation, each of the plurality of memory blocks BLK1, BLK2, . . . , and BLKi includes 1024 word lines WL, and the row decoder 130*a* may have a circuit configuration for selecting one word line WL from among 1024 word lines WL by decoding a row address RA<0:9>. According to the present embodiment, although it is described that each of the plurality of memory blocks BLK1, BLK2, . . . , and BLKi includes 1024 word lines according to a 10 row address RA<0:9> signals configuration, the embodiment is not limited thereto, and various numbers of word lines may be included. For example, the plurality of memory blocks BLK1, BLK2, . . . , and BLKi may each include 2048 or 4096 word lines according to an 11-row address RA<0:10> signal configuration or a 12-row address RA<0:11> signal configuration.

The row decoder 130*a* may include the main word line driving signal generation circuit 310, the sub word line driving signal generation circuit 320, the local main word line driving signal generation circuit 330, the first local sub word line driving signal generation circuit 340, the second local sub word line driving signal generation circuit 350, and the sub word line driving circuit 360.

Referring to FIG. 3, the circuit components of the row decoder 130*a* may be classified into a first circuit group and a second circuit group. The first circuit group may include a main word line driving signal generation circuit 310 and a sub word line driving signal generation circuit 320. The main word line driving signal generation circuit 310 may generate first main word line driving signals (e.g., NWE0<0:7>) and second main word line driving signals (e.g., NWE1<0:7>) based on signals of a more significant bit group from among row address signals. The sub word line driving signal generation circuit 320 may generate first sub word line driving signals (e.g., PXID<0:3>), second sub word line driving signals (e.g., MPXI<0:3>), and third sub word line driving signals (e.g., PXIB<0:3>) based on signals of a less significant bit group from among the row address signals. The second circuit group may include a local main word line driving signal generation circuit 330, a first local sub word line driving signal generation circuit 340, a second local sub word line driving signal generation circuit 350, and a sub word line driving circuit 360. The local main word line driving signal generation circuit 330 may generate local main word line driving signals (e.g., LNWEIB<0:63>) based on the first main word line driving signals (e.g., NWE0<0:7>) and the second main word line driving signals (e.g., NWE1<0:7>). The first local sub word line driving signal generation circuit 340 may generate first local sub word line driving signals (e.g., LPXID<0:15>) based on the first sub word line driving signals (e.g., PXID<0:3>) and the second sub word line driving signals (e.g., MPXI<0:3>). The second local sub word line driving signal generation circuit 350 may generate second local sub word line driving signals (e.g., LPXIB<0:15>) based on the second sub word line driving signals (e.g., MPXI<0:3>) and the third sub word line driving signals (e.g., PXIB<0:3>). The sub word line driving circuit 360 may be connected to word lines WL<0:1023> and may active one word line from among a plurality of word lines of a memory block selected from among the plurality of memory blocks based on the local main word line driving signals (e.g., LNWEIB<0:63>), the first local sub word line driving signals (e.g., LPXID<0:15>), and the second local sub word line driving signals (e.g., LPXIB<0:15>).

The main word line driving signal generation circuit 310 may generate a first main word line driving signal NWE0<0:7> and a second main word line driving signal NWE1<0:7> based on signals of a most significant bit (MSB) group from among row address RA<0:9> signals. From among the row address RA<0:9> signals, signals of the MSB group may be set to RA<4:9> row addresses. The RA<4:9> row addresses may include RA<7:9> row addresses corresponding to a more significant bit group (hereinafter referred to as “RA789” row addresses) and RA<4:6> row addresses corresponding to a less significant bit group (hereinafter referred to as “RA456” row addresses). The less significant bit group may represent lower-order bits of a row address, and the more significant bit group may represent higher-order bits of the row address. The terms “less significant” and “more significant” in the context of bit groups are relative, where the least significant bit (LSB) is the rightmost bit and the most significant bit (MSB) is the leftmost bit. The main word line driving signal generation circuit 310 may include a first main word line driving signal generation circuit 311 for generating the first main word line driving signal NWE0<0:7> by decoding the RA789 row addresses and a second main word line driving signal generation circuit 312 for generating the second main word line driving signal NWE1<0:7> by decoding the RA456 row addresses. Although an example in which the main word line driving signal generation circuit 310 according to the present embodiment divides MSB signals RA<4:9> from among the row address RA<0:9> signals into two groups (e.g., RA789 and RA456) and generates 8 first main word line driving signals NWE0<0:7> and 8 second main word line driving signals NWE1<0:7> based on MSB signals of the two groups RA789 and RA456 is described below, the embodiment is not limited thereto, and the main word line driving signal generation circuit 310 may also generate four of each of first to third main word line driving signals based on MSB signals of three groups (e.g., RA89, RA67, and RA45). To generalize, first through n-th main word line driving signals may be generated based on MSB signals of row address signals of n groups (“n” is a natural number). According to other embodiments, the main word line driving signal generation circuit 310 may change decoding for generating a plurality of main word line driving signals NWE0, NWE1, . . . , and NWEn−1 (“n” is a natural number) based on the number of bits (e.g., 5, 6, or 7) of MSB group signals from among row address signals according to the configuration (i.e., the number of word lines; e.g., 2048, 4096, etc.) of each of the plurality of memory blocks BLK1, BLK2, . . . , and BLKi. At this time, when the number of signals constituting a main word line driving signal NWEk (k is an integer equal to or greater than 0 and less than n) from among the plurality of main word line driving signals is num_k, the value obtained by multiplying all numbers from num_0 to num_n−1 may be equal to the value obtained by raising 2 to a power of the number of bits num_MSB of the MSB group signals. In other words, it may be 2num_MSB=num_0×num_1× . . . ×num_n−1. For example, when num_MSB=7 and n=3, it may be determined that num_0=8, num_1=4, num_2=4, and so on.

The first main word line driving signal generation circuit 311 of FIG. 4A may include first to fourth transistors 401 to 404 connected in series between a high voltage VPP line and a ground voltage VSS line and may include an inverter 406 connected to connection nodes 405 of a first transistor 401 and a second transistor 402. The first transistor 401 may be configured as a P-type metal oxide semiconductor (PMOS) transistor to which a pre-charge signal PCGB is connected to a gate thereof, and the second transistor 402 may be configured as an NMOS transistor to which the pre-charge signal PCGB is connected to a gate thereof. The pre-charge signal PCGB is provided based on a pre-charge command and may act as a signal for activating the row decoder 130*a*. The row decoder 130*a* may be activated by a logic high level pre-charge signal PCGB, and the row decoder 130*a* may be deactivated by a logic low level pre-charge signal PCGB. A third transistor 403 may be configured as an NMOS transistor to which a decoded RA789<0:7> row address signal is connected to a gate thereof, and a fourth transistor 404 may be configured as an NMOS transistor to which a block select signal BLK_SELECT is connected to a gate thereof. The block select signal BLK_SELECT may be provided to select one memory block from among the plurality of memory blocks BLK1, BLK2, . . . , and BLKi. For example, a logic high level first block select signal may be provided to select a first memory block BLK1. The inverter 406 connected to the connection nodes 405 of the first transistor 401 and the second transistor 402 may output the first main word line driving signal NWE0<0:7>.

Eight first main word line driving signal generation circuits 311 each may output the first main word line driving signal NWE0<0:7> in response to the decoded RA789<0:7> row address signal. Since the configuration of the decoded RA789<0:7> row address signal has eight cases (i.e., 000, 001, 010, 011, 100, 101, 110, and 111), the first main word line driving signal NWE0<0:7> may also have eight configurations. In other words, a logic high level may be assigned to any one of first main word driving signals NWE0<0>, NWE0<1>, NWE0<2>, NWE0<3>, NWE0<4>, NWE0<5>, NWE0<6> and NWE0<7> according to the decoded RA789<0:7> row address signals. The first main word line driving signal NWE0<0:7> of the logic high level may have the voltage level of the high voltage VPP and may be provided to the local main word line driving signal generation circuit 330 connected to each of the plurality of memory blocks BLK1, BLK2, . . . , and BLKi.

The second main word line driving signal generation circuit 312 of FIG. 4B may be constructed with a series connection of first to fourth transistors 411 to 414 connected between a high voltage VPP line and a ground voltage VSS line and may include an inverter 416 connected to connection nodes 415 of a first transistor 411 and a second transistor 412. The second main word line driving signal generation circuit 312 has the same configuration as the first main word line driving signal generation circuit 311 of FIG. 4A, except that a decoded RA456<0:7> row address signal is connected to a gate of a third transistor 413 and the inverter 416 outputs the second main word line driving signal NWE1<0:7>.

Eight second main word line driving signal generation circuits 312 each may output the second main word line driving signal NWE1<0:7> in response to the decoded RA456<0:7> row address signal. Since the configuration of the decoded RA456<0:7> row address signal has eight cases (i.e., 000, 001, 010, 011, 100, 101, 110, and 111), the second main word line driving signal NWE1<0:7> may also have eight configurations. In other words, a logic high level may be assigned to any one of first main word driving signals NWE1<0>, NWE1<1>, NWE1<2>, NWE1<3>, NWE1<4>, NWE1<5>, NWE1<6> and NWE1<7> according to the decoded RA456<0:7> row address signals. The second main word line driving signal NWE1<0:7> of the logic high level may have the voltage level of the high voltage VPP and may be provided to the local main word line driving signal generation circuit 330 connected to each of the plurality of memory blocks BLK1, BLK2, . . . , and BLKi.

As shown in FIG. 10, the main word line driving signal generation circuit 310 may include eight first main word line driving signal generation circuits 311 and eight second main word line driving signal generation circuits 312, that is, a total of sixteen (16) first and second main word line driving signal generation circuits 311 and 312. The main word line driving signal generation circuit 310 may be disposed in the peripheral circuit structure PCS, and the first main word line driving signal NWE0<0:7> and the second main word line driving signal NWE1<0:7> output from the main word line driving signal generation circuit 310 may be connected to the plurality of memory blocks BLK1, BLK2, . . . , and BLKi in common.

The sub word line driving signal generation circuit 320 of FIG. 3 may generate first to third sub word line driving signals MPXI<0:3>, PXID<0:3>, and PXIB<0:3> based on signals of a least significant bit (LSB) group from among the row address RA<0:9> signals. From among the row address RA<0:9> signals, signals of the LSB group may be set to RA<0:3> row addresses. The RA<0:3> row addresses may include RA<0:1> row addresses corresponding to a less significant bit group (hereinafter referred to as "RA01" row addresses) and RA<2:3> row addresses corresponding to a more significant bit group (hereinafter referred to as "RA23" row addresses). The sub word line driving signal generation circuit 320 may include a first sub word line driving signal generation circuit 321 for generating a first sub word line driving signal MPXI<0:3> by decoding the RA01 row addresses, a second sub word line driving signal generation circuit 323 for generating a second sub word line driving signal PXID<0:3> by decoding the RA23 row addresses, and a third sub word line driving signal generation circuit 325 for generating a third sub word line driving signal PXIB<0:3> by decoding the RA23 row addresses.

Although an example in which the sub word line driving signal generation circuit 320 according to the present embodiment divides LSB signals RA<0:3> from among the row address RA<0:9> signals into two groups (e.g., RA23 and RA01) and generates four of each of sub word line driving signals MPXI<0:4>, PXID<0:3>, and PXIB<0:3> based on LSB signals of the two groups RA23 and RA01 is described below, the embodiment is not limited thereto, and the sub word line driving signal generation circuit 320 may generate two of each of even sub word line driving signals PXID<0>, PXID<2>, PXIB<0>, and PXIB<2> and two of each of odd sub word line driving signals PXID<1>, PXID<3>, PXIB<1>, and PXIB<3>. According to other embodiments, the sub word line driving signal generation circuit 320 may change decoding for generating a plurality of sub word line driving signals MPXIi, PXIDj, and PXIBk (i, k, and k are natural numbers) based on the number of bits (e.g., 3, 4, or 5) of LSB group signals from among row address signals according to the configuration (i.e., the number of word lines; e.g., 2048, 4096, etc.) of each of the plurality of memory blocks BLK1, BLK2, . . . , and BLKi.

The first sub word line driving signal generation circuit 321 of FIG. 5A may include first to fourth transistors 501 to 504 connected in series between a high voltage VPP line and a ground voltage VSS line and may include a first inverter 506 and a second inverter 507 respectively connected to connection nodes 505 of the first transistor 501 and the second transistor 502 in series. The first transistor 501 may be configured as a PMOS transistor to which the pre-charge signal PCGB is connected to a gate thereof, and the second transistor 502 may be configured as an NMOS transistor to which the pre-charge signal PCGB is connected to a gate thereof. The third transistor 503 may be configured as an NMOS transistor to which a decoded RA01<0:3> row address signal is connected to a gate thereof, and the fourth transistor 504 may be configured as an NMOS transistor to which the block select signal BLK_SELECT is connected to a gate thereof. The second inverter 507 may output the first sub word line driving signal MPXI<0:3>.

Four first sub word line driving signal generation circuits 321 each may output the first sub word line driving signal MPXI<0:3> in response to the decoded RA01<0:3> row address signal. Since the configuration of the decoded RA01<0:3> row address signal has four cases (i.e., 00, 01, 10, and 11), the activated first sub word line driving signal MPXI<0:3> may also have four configurations. In other words, a logic low level may be assigned to any one of first sub word line driving signals MPXI<0>, MPIX<1>, MPIX<2>, and MPIX<3> according to the decoded RA01<0:3> row address signals. The first sub word line driving signal MPXI<0:3> of the logic low level may have the voltage level of the ground voltage VSS and may be provided to the first local sub word line driving signal generation circuit 340 and the second local sub word line driving signal generation circuit 350 connected to each of the plurality of memory blocks BLK1, BLK2, . . . , and BLKi.

The second sub word line driving signal generation circuit 323 of FIG. 5B may include first to fourth transistors 511 to 514 connected in series between a high voltage VPP line and a ground voltage VSS line and may include a first inverter 516 and a second inverter 517 respectively connected to connection nodes 515 of the first transistor 511 and the second transistor 512 in series. The second sub word line driving signal generation circuit 323 has the same configuration as the first sub word line driving signal generation circuit 321 of FIG. 5A, except that a decoded RA23<0:3> row address signal is connected to a gate of the third transistor 513 and the second inverter 517 outputs the second sub word line driving signal PXID<0:3>.

Four second sub word line driving signal generation circuits 323 each may output the second sub word line driving signal PXID<0:3> in response to the decoded RA23<0:3> row address signal. Since the configuration of the decoded RA23<0:3> row address signal has four cases (i.e., 00, 01, 10, and 11), the activated second sub word line driving signal PXID<0:3> may also have four configurations. In other words, a logic low level may be assigned to any one of second sub word line driving signals PXID<0>, PXID<1>, PXID<2>, and PXID<3> according to the decoded RA23<0:3> row address signals. The second sub word line driving signal PXID<0:3> of the logic low level may have the voltage level of the ground voltage VSS and may be provided to first local sub word line driving signal generation circuits 340 respectively connected to the plurality of memory blocks BLK1, BLK2, . . . , and BLKi.

The third main word line driving signal generation circuit 325 of FIG. 5C may include first to fourth transistors 521 to 524 connected in series between a high voltage VPP line and a ground voltage VSS line and may include an inverter 526 connected to connection nodes 525 of the first transistor 521 and the second transistor 522. The third sub word line driving signal generation circuit 325 has the same configuration as the second sub word line driving signal generation circuit 323 of FIG. 5B, except that the inverter 526 connected to the connection nodes 525 of the first transistor 521 and the second transistor 522 outputs the third sub word line driving signal PXIB<0:3>. The second sub word line driving signal PXID<0:3> and the third sub word line driving signal PXIB<0:3> have logic levels opposite to each other.

Four third sub word line driving signal generation circuits 325 each may output the third sub word line driving signal PXIB<0:3> in response to the decoded RA23<0:3> row address signal. Since the configuration of the decoded RA23<0:3> row address signal has four cases (i.e., 00, 01, 10, and 11), the activated third sub word line driving signal PXIB<0:3> may also have four configurations. In other words, a logic high level may be assigned to any one of third sub word line driving signals PXIB<0>, PXIB<1>, PXIB<2>, and PXIB<3> according to the decoded RA23<0:3> row address signals. The third sub word line driving signal PXIB<0:3> of the logic high level may have the voltage level of the high voltage VPP and may be provided to second local sub word line driving signal generation circuits 350 respectively connected to the plurality of memory blocks BLK1, BLK2, . . . , and BLKi.

As shown in FIG. 10, the sub word line driving signal generation circuit 320 may include four first sub word line driving signal generation circuits 321, four second sub word line driving signal generation circuits 323, and four third sub word line driving signal generation circuits 325, that is, a total of 12 first to third sub word line driving signal generation circuits 321, 323, and 325. The sub word line driving signal generation circuit 320 may be disposed in the peripheral circuit structure PCS, and the first sub word line driving signal MPXI<0:3>, the second sub word line driving signal PXID<0:3> and the third sub word line driving signal PXIB<0:3> output from the sub word line driving signal generation circuit 320 may be connected to the plurality of memory blocks BLK1, BLK2, . . . , and BLKi in common.

The local main word line driving signal generation circuit 330 of FIG. 3 may be connected to each of the memory blocks BLK1, BLK2, . . . , and BLKi and generate a local main word line driving signal LNWEIB<0:63> based on the first main word line driving signal NWE0<0:7> and the second main word line driving signal NWE1<0:7> provided by the main word line driving signal generation circuit 310.

The local main word line driving signal generation circuit 330 of FIG. 6 may constitute a NAND logic circuit including first to fourth transistors 601 to 604 connected between a high voltage VPP line and a negative voltage VBB line. The first transistor 601 and the second transistor 602 may be configured as PMOS transistors connected in parallel between the high voltage VPP line and connection nodes 605 of first to third transistors 601 to 603, the first main word line driving signal NWE0<0:7> may be connected to a gate of the first transistor 601, and the second main word line driving signal NWE1<0:7> may be connected to a gate of the second transistor 602. The third transistor 603 and the fourth transistor 604 may be configured as NMOS transistors connected in series between the connection node 605 and the negative voltage VBB line, the first main word line driving signal NWE0<0:7> may be connected to a gate of the third transistor 603, and the second main word line driving signal NWE1<0:7> may be connected to a gate of the fourth transistor 604. A local main word line driving signal LNWEIB<0:63> may be output from the connection nodes 605 of the first to third transistors 601 to 603.

As shown in FIG. 10, 63 local main word line driving signal generation circuits 330 each outputting the local main word line driving signal LNWEIB<0:63> in response to the first main word line driving signal NWE0<0:7> and the second main word line driving signal NWE1<0:7> may be arranged in portions of the peripheral circuit structure PCS respectively corresponding to the plurality of memory blocks BLK1, BLK2, . . . , and BLKi. The local main word line driving signal generation circuit 330 may activate any one of 64 local main word line driving signals LNWEIB<0:63> to the logic low level in response to the logic high level of the activated first main word line driving signal NWE0<0:7> and the activated second main word line driving signal NWE1<0:7>. The local main word line driving signal LNWEIB<0:63> of the logic low level may have the voltage level of the negative voltage VBB and may be provided to the sub word line driving circuit 360 connected to each of the plurality of memory blocks BLK1, BLK2, . . . , and BLKi.

The first local sub word line driving signal generation circuit 340 of FIG. 3 may be connected to each of the plurality of memory blocks BLK1, BLK2, . . . , and BLKi and generate a first local sub word line driving signal LPXID<0:15> based on the first sub word line driving signal MPXI<0:3> provided by the first sub word line driving signal generation circuit 321 and the second sub word line driving signal PXID<0:3> provided by the second sub word line driving signal generation circuit 323.

The first local sub word line driving signal generation circuit 340 of FIG. 7 may constitute a NOR logic circuit including first to fourth transistors 701 to 704 connected between a high voltage VPP line and a negative voltage VBB line. The first transistor 701 and the second transistor 702 may be configured as PMOS transistors connected in parallel between the high voltage VPP line and connection nodes 705 of the second to fourth transistors 702 to 704, the first sub word line driving signal MPXI<0:3> may be connected to a gate of the first transistor 701, and the second sub word line driving signal PXID<0:3> may be connected to a gate of the second transistor 702. The third transistor 703 and the fourth transistor 704 may be configured as NMOS transistors connected in parallel between the connection nodes 705 of the second to fourth transistors 702 to 704 and the the negative voltage VBB line, the second sub word line driving signal PXID<0:3> may be connected to a gate of the third transistor 703, and the first sub word line driving signal MPXI<0:3> may be connected to a gate of the fourth transistor 704. The first local sub word line driving signal LPXID<0:15> may be output from the connection nodes 705 of the second to fourth transistors 702 to 704.

As shown in FIG. 10, sixteen (16) first local sub word line driving signal generation circuits 340 each outputting the first local sub word line driving signal LPXID<0:15> in response to the first sub word line driving signal MPXI<0:3> and the second sub word line driving signal PXID<0:3> may be arranged in portions of the peripheral circuit structure PCS respectively corresponding to the plurality of memory blocks BLK1, BLK2, . . . , and BLKi. The first local sub word line driving signal generation circuit 340 may activate any one of the 16 first local sub word line driving signals LPXID<0:15> to the logic high level in response to the logic low level of the activated first sub word line driving signal MPXI<0:3> and the activated second sub word line driving signal PXID<0:3>. The first local sub word line driving signal LPXID<0:15> of the logic high level may have the voltage level of the high voltage VPP and may be provided to the sub word line driving circuit 360 connected to each of the plurality of memory blocks BLK1, BLK2, . . . , and BLKi.

The second local sub word line driving signal generation circuit 350 of FIG. 3 may be connected to each of the plurality of memory blocks BLK1, BLK2, . . . , and BLKi and generate a second local sub word line driving signal LPXIB<0:15> based on the first sub word line driving signal MPXI<0:3> provided by the first sub word line driving signal generation circuit 321 and the third sub word line driving signal PXIB<0:3> provided by the third sub word line driving signal generation circuit 325.

The second local sub word line driving signal generation circuit 350 of FIG. 8 may include first to sixth transistors 801 to 806 connected between a high voltage VPP line and a negative voltage VBB line, wherein the first transistor 801 and the second transistor 802 may constitute an inverter circuit, and the third to sixth transistors 803 to 806 may constitute a NAND logic circuit. The first transistor 801 may be configured as a PMOS transistor, which is connected between the high voltage VPP line and connection nodes 807 of the first transistor 801 and the second transistor 802 and the first sub word line driving signal MPXI<0:3> is applied to a gate of the first transistor 801, and the second transistor 802 may be configured as an NMOS transistor, which is connected between the connection node 807 of the first transistor 801 and the second transistor 802 and the negative voltage VBB line and the first sub word line driving signal MPXI<0:3> is applied to a gate of the second transistor 802. The third transistor 803 and the fourth transistor 804 may be configured as PMOS transistors connected in parallel between the high voltage VPP line and connection nodes 808 of the third to fifth transistors 803 to 805, wherein the third sub word line driving signal PXIB<0:3> may be connected to a gate of the third transistor 803, and the connection nodes 807 of the first transistor 801 and the second transistor 801 and 802 may be connected to a gate of the fourth transistor 804. The fifth transistor 805 and a sixth transistor 806 may be configured as NMOS transistors connected in parallel between the connection nodes 808 of the third to fifth transistors 803 to 805 and the negative voltage VBB line, wherein the third sub word line driving signal PXIB<0:3> may be connected to a gate of the fifth transistor 805, and the connection nodes 807 of the first transistor 801 and the second transistor 801 and 802 may be connected to a gate of the sixth transistor 806. The second local sub word line driving signal LPXIB<0:15> may be output from the connection nodes 808 of the third to fifth transistors 803 to 805.

As shown in FIG. 10, sixteen (16) second local sub word line driving signal generation circuits 350 each outputting the second local sub word line driving signal LPXIB<0:15> in response to the first sub word line driving signal MPXI<0:3> and the third sub word line driving signal PXIB<0:3> may be arranged in portions of the peripheral circuit structure PCS respectively corresponding to the plurality of memory blocks BLK1, BLK2, . . . , and BLKi. The second local sub word line driving signal generation circuit 350 may activate any one of the 16 second local sub word line driving signals LPXIB<0:15> to the logic low level in response to the logic low level of activated first sub word line driving signal MPXI<0:3> and the logic high level of the activated third sub word line driving signal PXIB<0:3>. The second local sub word line driving signal LPXIB<0:15> of the logic low level may have the voltage level of the negative voltage VBB and may be provided to the sub word line driving circuit 360 connected to each of the plurality of memory blocks BLK1, BLK2, . . . , and BLKi.

The sub word line driving circuit 360 of FIG. 3 is connected to each of the plurality of memory blocks BLK1, BLK2, . . . , and BLKi, select one word line from among word lines WL<0:1023> based on the local main word line driving signal LNWEIB<0:63> provided by the local main word line driving signal generation circuit 330, the first local sub word line driving signal LPXID<0:15> provided by the first local sub word line driving signal generation circuit 340, and the second local sub word line driving signal LPXIB<0:15> provided by the second local sub word line driving signal generation circuit 350, and drive a selected word line by using the high voltage VPP.

The sub word line driving circuit 360 of FIG. 9 may include first to third transistors 901 to 903. The first transistor 901 may be configured as a PMOS transistor, in which a line of the first local sub word line driving signal LPXID<0:15> is connected to a source of the first transistor 901, connection nodes 904 of the first to third transistors 901 to 903 are connected to a drain of the first transistor 901, and the local main word line driving signal LNWEIB<0:63> is applied to a gate of the first transistor 901. The second transistor 902 may be configured as an NMOS transistor, in which a negative voltage VBB line is connected to a source of the second transistor 902, the connection nodes 904 of the first to third transistors 901 to 903 are connected to a drain of the second transistor 902, and the local main word line driving signal LNWEIB<0:63> is applied to a gate of the second transistor 902. The third transistor 903 may be configured as an NMOS transistor, in which the negative voltage VBB line is connected to a source of the third transistor 903, the connection nodes 904 of the first to third transistors 901 to 903 are connected to a drain of the third transistor 903, and the second local sub word line driving signal LPXIB<0:15> is applied to a gate of the third transistor 903. The connection nodes 904 of the first to third transistors 901 to 903 may be connected to the word lines WL<0:1023> of each of the plurality of memory blocks BLK1, BLK2, . . . , and BLKi.

As shown in FIG. 10, sub word line driving circuits 360 may be disposed in portions of the peripheral circuit structure PCS respectively corresponding to the plurality of memory blocks BLK1, BLK2, . . . , and BLKi. 1024 sub word line driving circuits 360 may be arranged to be respectively connected to the word lines WL<0:1023> in response to the local main word line driving signal LNWEIB<0:63>, the first local sub word line driving signal LPXID<0:15>, and the second local sub word line driving signal LPXIB<0:15>. The sub word line driving circuit 360 may select any one from among the 1024 word lines WL<0:1023> in response to the logic low level of the activated local main word line driving signal LNWEIB<0:63>, the logic high level of the activated first local sub word line driving signal LPXID<0:15>, and the logic low level of the activated second local sub word line driving signal LPXIB<0:15> and activate a selected word line to the logic high level. A word line selected from among the word lines WL<0:1023> may be activated to the level of the high voltage VPP of the first local sub word line driving signal LPXID<0:15> of the logic high level.

Referring to FIG. 10, a region R1, which is a region of a portion of the peripheral circuit structure PCS corresponding to the first memory block BLK1 remaining after the local main word line driving signal generation circuit 330, the first local sub word line driving signal generation circuit 340, the second local sub word line driving signal generation circuit 350, and the sub word line driving circuit 360 are arranged, is shown. Power lines (e.g., VPP, VSS, and VBB) of the memory device 10 may be arranged in the region R1 to stabilize power of the memory device 10. Therefore, the operation performance of the memory device 10 may be improved.

Figure 11:
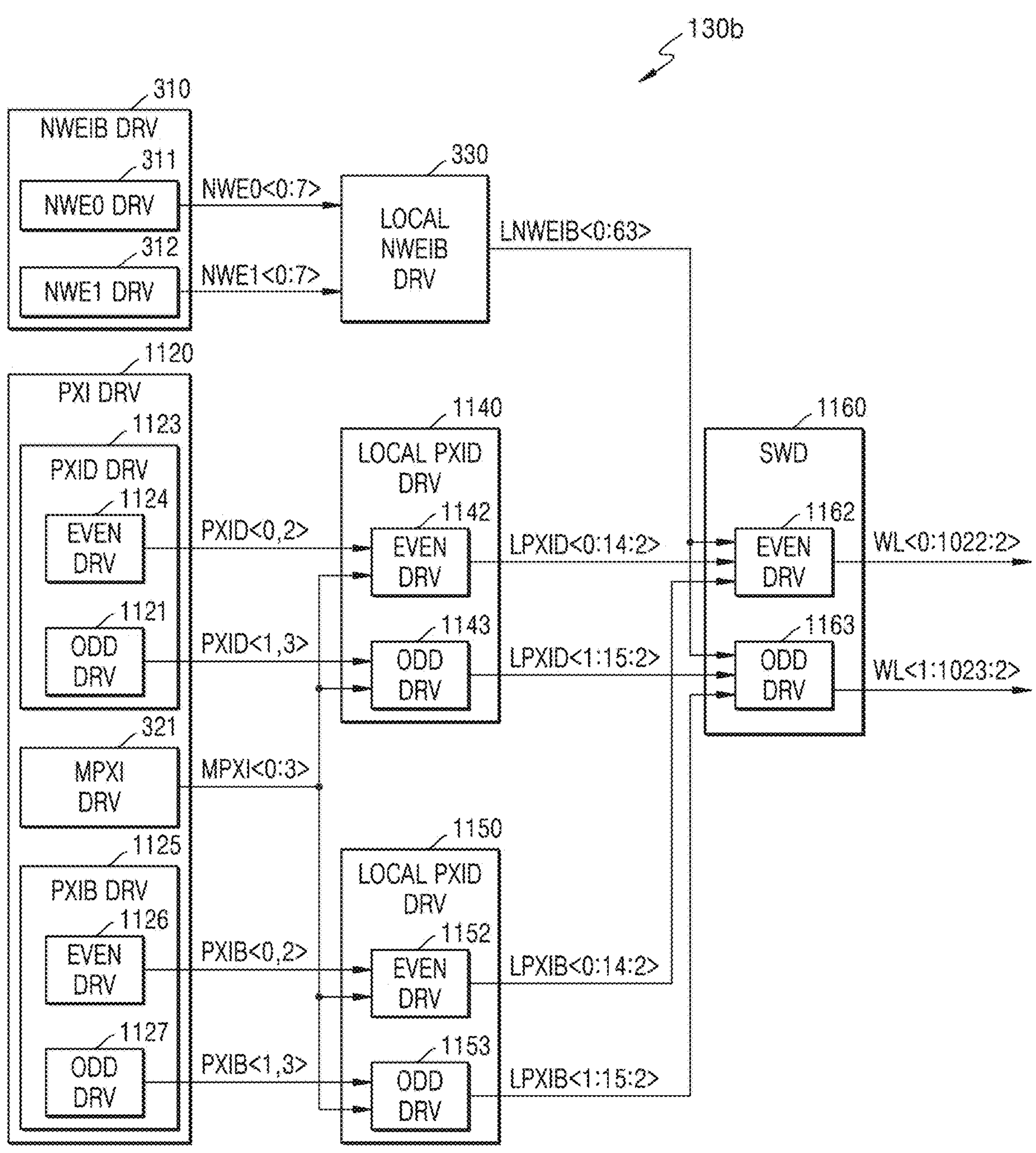
FIG. 11 is a block diagram for describing a row decoder according to embodiments.
Figure 15A:
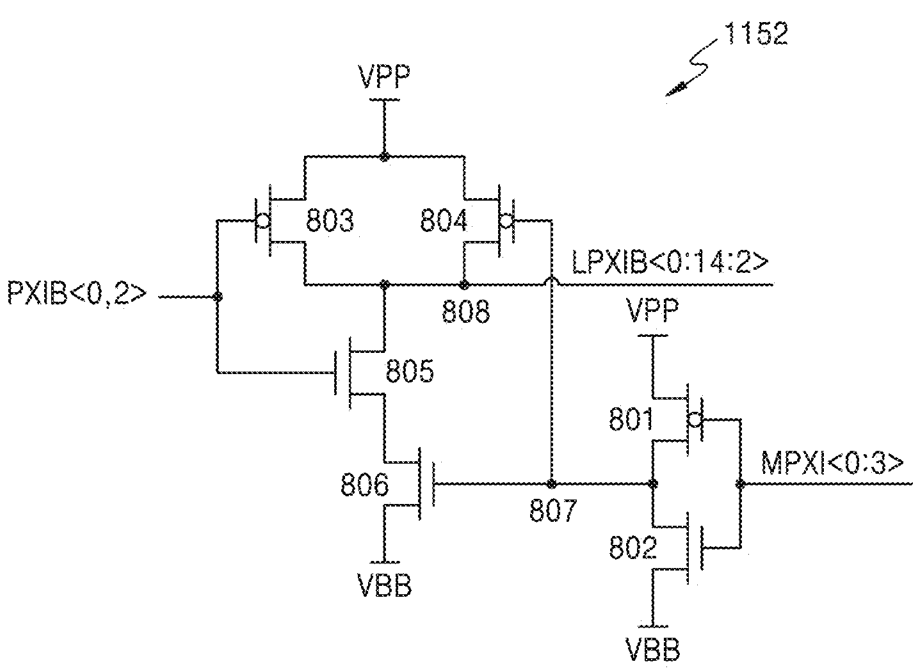
FIGS. 15A and 15B are circuit diagrams for describing a second local sub word line driving signal generation circuit of FIG. 11.
Figure 15B:
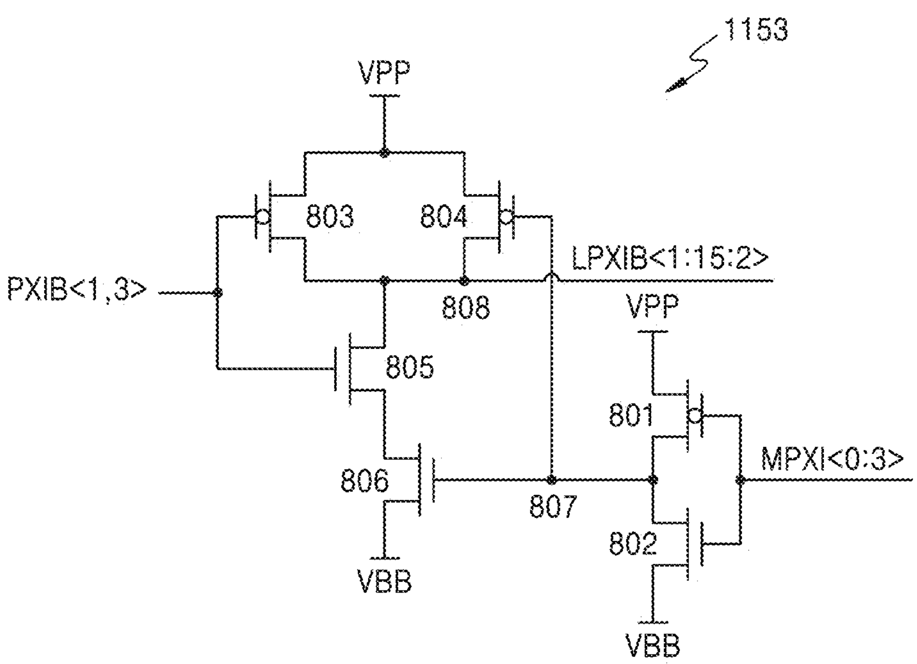
Figure 16A:
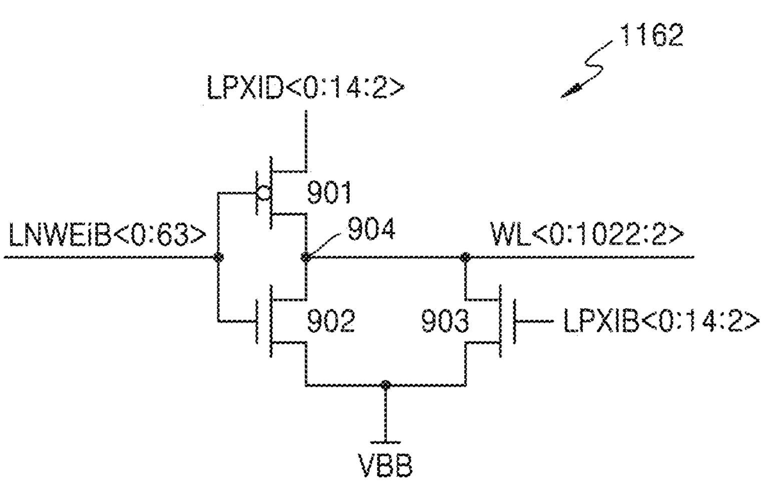
FIGS. 16A and 16B are circuit diagrams for describing a sub word line driving circuit of FIG. 11.
Figure 16B:
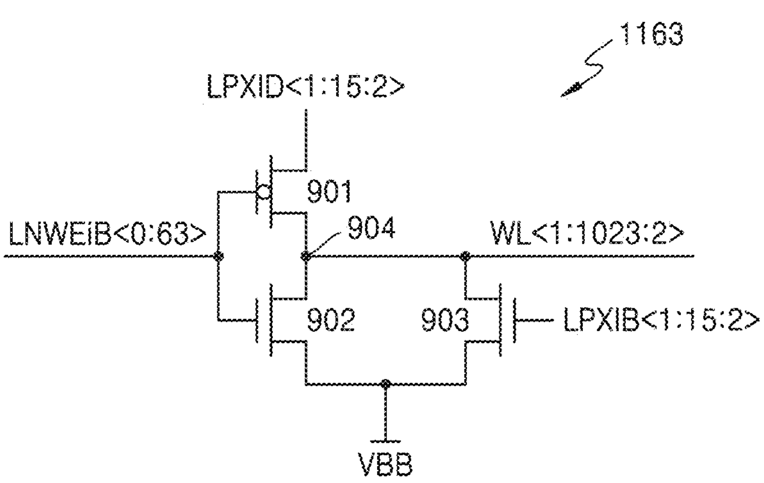
Figure 17:
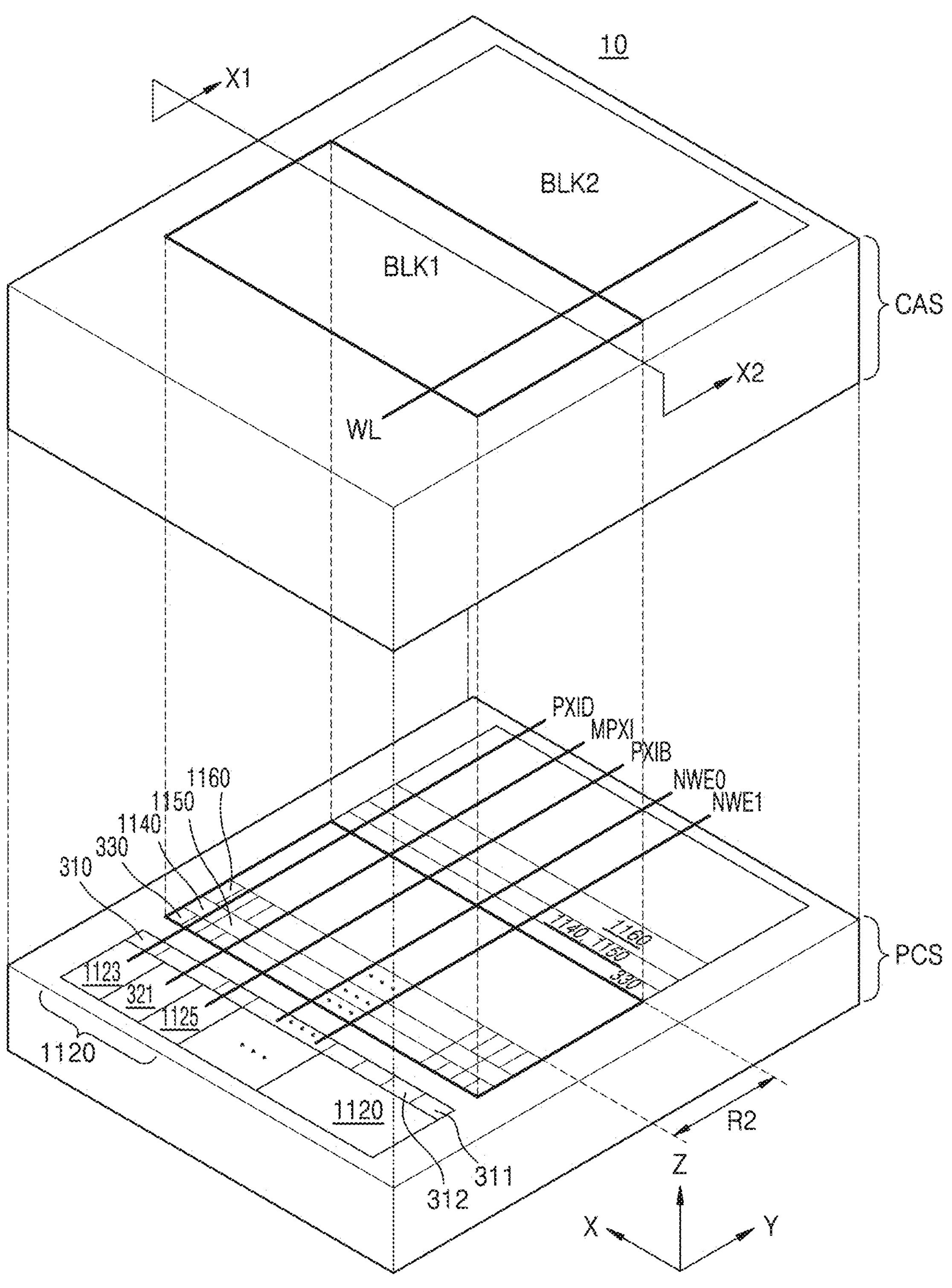
FIG. 17 is a diagram for describing a row decoder architecture in which a row decoder of FIG. 11 is disposed in a memory device.

FIGS. 11 to 17 are diagrams for describing a row decoder according to embodiments. FIG. 11 is a block diagram for describing a row decoder 130*b* of FIG. 1. FIGS. 12A and 12B are circuit diagrams for describing a second sub word line driving signal generation circuit 1123 of FIG. 11. FIGS. 13A and 13B are circuit diagrams for describing a third sub word line driving signal generation circuit 1125 of FIG. 11. FIGS. 14A and 14B are circuit diagrams for describing a first local sub word line driving signal generation circuit 1140 of FIG. 11. FIGS. 15A and 15B are circuit diagrams for describing a second local sub word line driving signal generation circuit 1150 of FIG. 11. FIGS. 16A and 16B are circuit diagrams for describing a sub word line driving circuit 1160 of FIG. 11. FIG. 17 is a diagram for describing a row decoder architecture in which the row decoder 130*b* of FIG. 11 is disposed in the memory device 10.

Referring to FIG. 11, unlike the row decoder 130*a* of FIG. 3, in the row decoder 130*b*, the second sub word line driving signal generation circuit 1123 and the third sub word line driving signal generation circuit 1125 in a sub word line driving signal generation circuit 1120, the first local sub word line driving signal generation circuit 1140, the second local sub word line driving signal generation circuit 1150, and the sub word line driving circuit 1160 are categorized into first circuits (e.g., 1124, 1126, 1142, 1152, and 1162) associated with even word lines WL<0:1022:2> and second circuits (e.g., 1125, 1127, 1143, 1153, and 1163) associated with odd word lines WL<0:1023:2>. For convenience of explanation, the first circuits 1123, 1126, 1142, 1152, and 1162 may be referred to as even circuits and the second circuits 1121, 1127, 1143, 1153, and 1163 may be referred to as odd circuits. Hereinafter, descriptions regarding the row decoder 130*b* identical to those given above with reference to FIG. 3 will be omitted.

The second sub word line driving signal generation circuit 1123 of FIG. 11 may include an even circuit 1124 and an odd circuit 1121 configured to generate the second sub word line driving signal PXID<0:3> by decoding the RA23 row addresses.

Figure 12A:
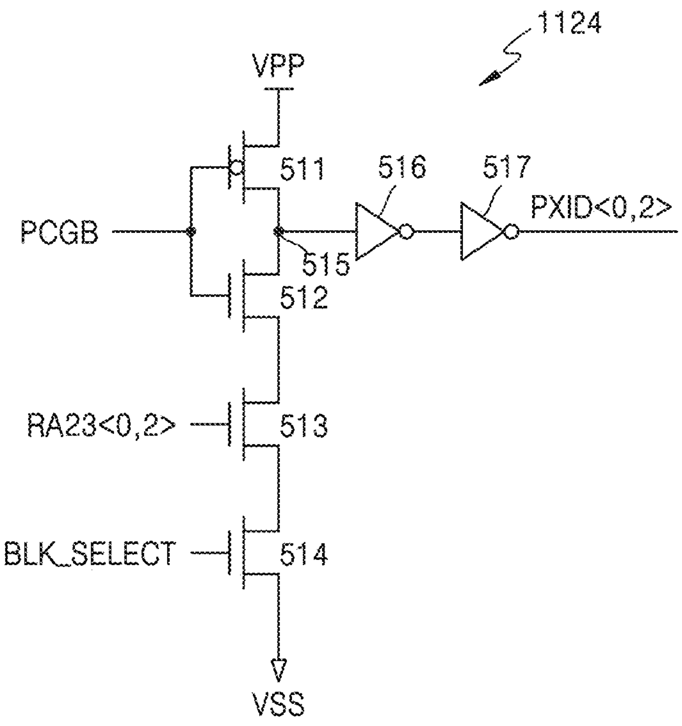
FIGS. 12A and 12B are circuit diagrams for describing a second sub word line driving signal generation circuit of FIG. 11.
Figure 12B:
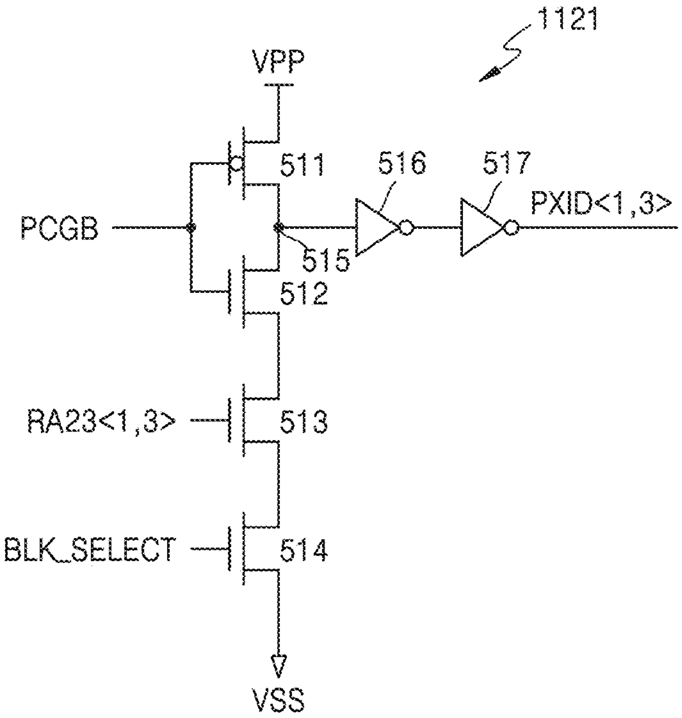

Similar to the second sub word line driving signal generation circuit 323 of FIG. 5B, the even circuit 1124 of the second sub word line driving signal generation circuit 1123 of FIG. 12A includes first to fourth transistors 511 to 514, a first inverter 516, and a second inverter 517 and decoded RA23<0> and RA23<2> row address signals are connected to a gate of the third transistor 513. However, unlike the second sub word line driving signal generation circuit 323 of FIG. 5B, in the even circuit 1124 of the second sub word line driving signal generation circuit 1123 of FIG. 12A, the second inverter 517 outputs second sub word line driving signals PXID<0> and PXID<2>. Two even circuits 1124 of the second sub word line driving signal generation circuit 1123 may be provided to output the second sub word line driving signals PXID<0> and PXID<2> in response to the decoded RA23<0> and RA23<2> row address signals, respectively. The second sub word line driving signals PXID<0> and PXID<2> may be activated to the logic low level according to the logic high level of the decoded RA23<0> and RA23<2> row address signals, respectively. The second sub word line driving signals PXID<0> and PXID<2> of the logic low level may have the voltage level of the ground voltage VSS and may be provided to even circuits 1142 of first local sub word line driving signal generation circuits 1140 respectively connected to the plurality of memory blocks BLK1, BLK2, . . . , and BLKi.

Similar to the second sub word line driving signal generation circuit 323 of FIG. 5B, the odd circuit 1121 of the second sub word line driving signal generation circuit 1123 of FIG. 12A includes the first to fourth transistors 511 to 514, the first inverter 516, and the second inverter 517 and decoded RA23<1> and RA23<3> row address signals are connected to the gate of the third transistor 513. However, unlike the second sub word line driving signal generation circuit 323 of FIG. 5B, in the odd circuit 1121 of the second sub word line driving signal generation circuit 1123 of FIG. 12A, the second inverter 517 outputs second sub word line driving signals PXID<1> and PXID<3>. Two odd circuits 1121 of the second sub word line driving signal generation circuit 1123 may be provided to output the second sub word line driving signals PXID<1> and PXID<3> in response to the decoded RA23<1> and RA23<3> row address signals, respectively. The second sub word line driving signals PXID<1> and PXID<3> may be activated to the logic low level according to the logic high level of the decoded RA23<1> and RA23<3> row address signals, respectively. The second sub word line driving signals PXID<1> and PXID<3> of the logic low level may have the voltage level of the ground voltage VSS and may be provided to odd circuits 1143 of first local sub word line driving signal generation circuits 1140 respectively connected to the plurality of memory blocks BLK1, BLK2, . . . , and BLKi.

The third sub word line driving signal generation circuit 1125 of FIG. 11 may include an even circuit 1126 and an odd circuit 1127 configured to generate the third sub word line driving signal PXIB<0:3> by decoding the RA23 row addresses.

Figure 13A:
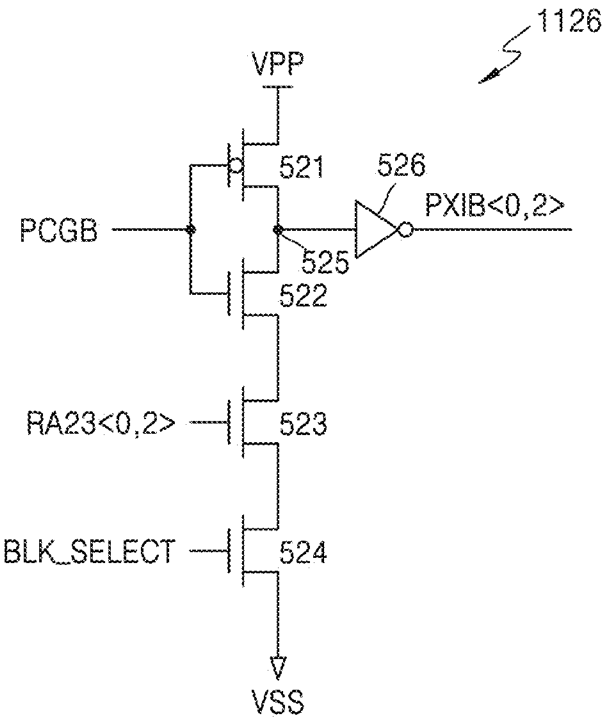
FIGS. 13A and 13B are circuit diagrams for describing a third sub word line driving signal generation circuit of FIG. 11.

Similar to the third sub word line driving signal generation circuit 325 of FIG. 5C, the even circuit 1126 of the third sub word line driving signal generation circuit 1125 of FIG. 13A includes the first to fourth transistors 521 to 524 and the inverter 526 and decoded RA23<0> and RA23<2> row address signals are connected to a gate of a third transistor 523. However, unlike the third sub word line driving signal generation circuit 325 of FIG. 5C, in the even circuit 1126 of the third sub word line driving signal generation circuit 1125 of FIG. 13A, the inverter 526 outputs third sub word line driving signals PXIB<0> and PXIB<2>. Two even circuits 1126 of the third sub word line driving signal generation circuit 1125 may be provided to output the third sub word line driving signals PXIB<0> and PXIB<2> in response to the decoded RA23<0> and RA23<2> row address signals, respectively. The second sub word line driving signals PXIB<0> and PXIB<2> may be activated to the logic high level according to the logic high level of the decoded RA23<0> and RA23<2> row address signals, respectively. The third sub word line driving signals PXIB<0> and PXIB<2> of the logic high level may have the voltage level of the high voltage VPP and may be provided to even circuits 1152 of second local sub word line driving signal generation circuits 1150 respectively connected to the plurality of memory blocks BLK1, BLK2, . . . , and BLKi.

Figure 13B:
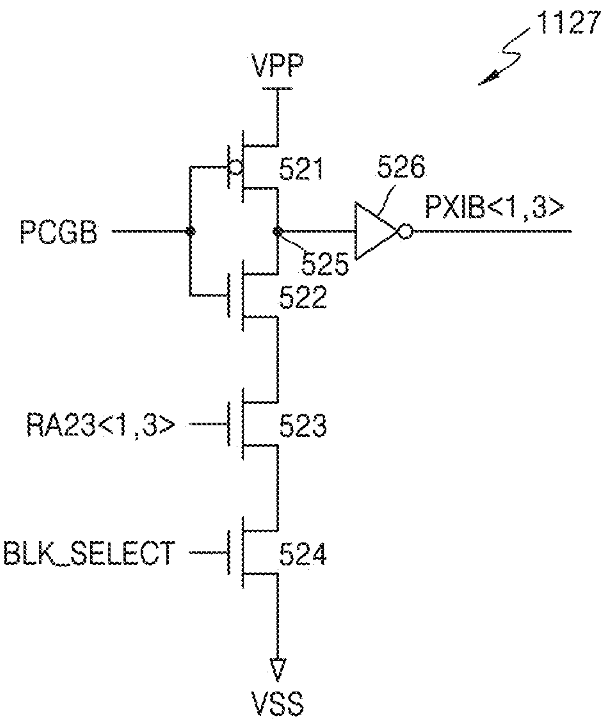

Similar to the second sub word line driving signal generation circuit 1123 of FIG. 5C, the odd circuit 1127 of the third sub word line driving signal generation circuit 1125 of FIG. 13B includes the first to fourth transistors 521 to 524 and the inverter 526 and decoded RA23<1> and RA23<3> row address signals are connected to a gate of the third transistor 523. However, unlike the second sub word line driving signal generation circuit 1123 of FIG. 5C, in the odd circuit 1127 of the third sub word line driving signal generation circuit 1125 of FIG. 13B, the inverter 526 outputs third sub word line driving signals PXIB<1> and PXIB<3>. Two odd circuits 1127 of the third sub word line driving signal generation circuit 1125 may be provided to output the third sub word line driving signals PXIB<1> and PXIB<3> in response to the decoded RA23<1> and RA23<3> row address signals, respectively. The second sub word line driving signals PXIB<1> and PXIB<3> may be activated to the logic high level according to the logic high level of the decoded RA23<1> and RA23<3> row address signals, respectively. The third sub word line driving signals PXIB<1> and PXIB<3> of the logic high level may have the voltage level of the high voltage VPP and may be provided to odd circuits 1153 of the second local sub word line driving signal generation circuits 1150 respectively connected to the plurality of memory blocks BLK1, BLK2, . . . , and BLKi.

As shown in FIG. 17, the sub word line driving signal generation circuit 1120 may include four first sub word line driving signal generation circuits 321, four second sub word line driving signal generation circuits 1123, and four third sub word line driving signal generation circuits 1125, that is, a total of 12 first to third sub word line driving signal generation circuits 321, 1123, and 1125. The four second sub word line driving signal generation circuits 1123 may include two even circuits 1124 and two odd circuits 1125, and the four third sub word line driving signal generation circuits 1125 may include two even circuits 1126 and two odd circuits 1127. The sub word line driving signal generation circuit 1120 may be disposed in the peripheral circuit structure PCS, and the first sub word line driving signal MPXI<0:3>, the second sub word line driving signal PXID<0:3> and the third sub word line driving signal PXIB<0:3> output from the sub word line driving signal generation circuit 1120 may be connected to the plurality of memory blocks BLK1, BLK2, . . . , and BLKi in common.

The first local sub word line driving signal generation circuit 1140 of FIG. 11 may include an even circuit 1142 and an odd circuit 1143 configured to generate the first local sub word line driving signal LPXID<0:15> based on the first sub word line driving signal MPXI<0:3> provided by the first sub word line driving signal generation circuit 321 and the second sub word line driving signal PXID<0:3> provided by the second sub word line driving signal generation circuit 1123.

Figure 14A:
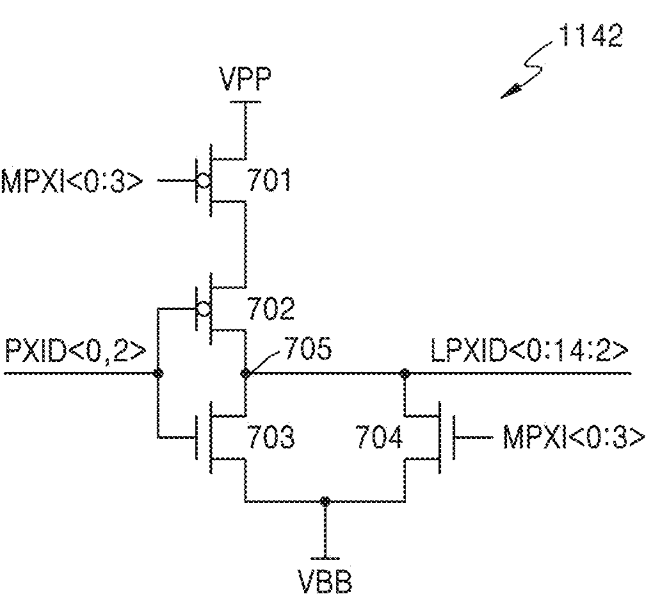
FIGS. 14A and 14B are circuit diagrams for describing a first local sub word line driving signal generation circuit of FIG. 11.

Similar to the first local sub word line driving signal generation circuit 340 of FIG. 7, the even circuit 1142 of the first local sub word line driving signal generation circuit 1140 of FIG. 14A includes the first to fourth transistors 701 to 704 and the second sub word line driving signals PXID<0> and PXID<2> are connected to gates of the second transistor 702 and the third transistor 703. However, unlike the first local sub word line driving signal generation circuit 340 of FIG. 7, in the even circuit 1142 of the first local sub word line driving signal generation circuit 1140 of FIG. 14A, a first local sub word line driving signal LPXID<0:14:2> is output from the connection nodes 705 of the second to fourth transistors 702 to 704. Eight even circuits 1142 of the first local sub word line driving signal generation circuit 1140 may be provided to respectively output first local sub word line driving signals LPXID<0>, LPXID<2>, LPXID<4>, LPXID<6>, LPXID<8>, LPXID<10>, LPXID<12>, and LPXID<14> in response to the first sub word line driving signal MPXI<0:3> and the second sub word line driving signals PXID<0> and PXID<2>. The even circuit 1142 of the first local sub word line driving signal generation circuit 1140 may activate any one of eight first local sub word line driving signals LPXID<0:14:2> to the logic high level in response to the logic low level of the activated first sub word line driving signal MPXI<0:3> and the activated second sub word line driving signals PXID<0> and PXID<2>. The first local sub word line driving signal LPXID<0:14:2> of the logic high level may have the voltage level of the high voltage VPP and may be provided to an even circuit 1162 of the sub word line driving circuit 1160 connected to each of the plurality of memory blocks BLK1, BLK2, . . . , and BLKi.

Figure 14B:
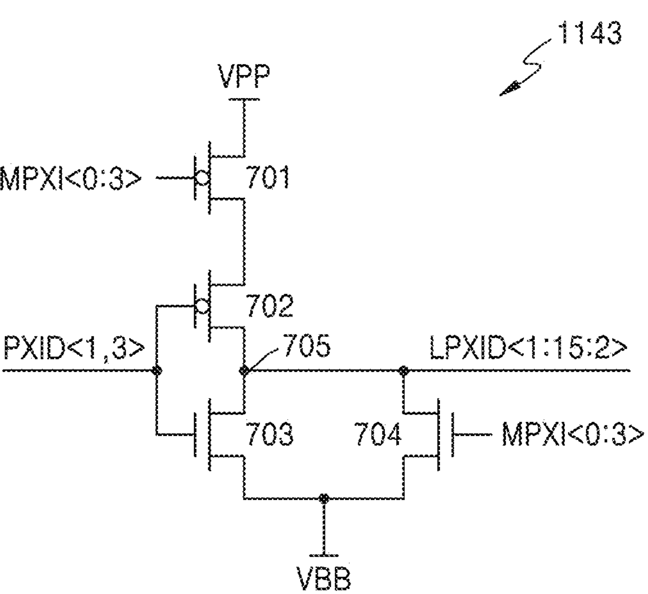

Similar to the first local sub word line driving signal generation circuit 340 of FIG. 7, the odd circuit 1143 of the first local sub word line driving signal generation circuit 1140 of FIG. 14B includes the first to fourth transistors 701 to 704 and the second sub word line driving signals PXID<1> and PXID<3> are connected to the gates of the second transistor 702 and the third transistor 703. However, unlike the first local sub word line driving signal generation circuit 340 of FIG. 7, in the odd circuit 1143 of the first local sub word line driving signal generation circuit 1140 of FIG. 14B, a first local sub word line driving signal LPXID<1:15:2> is output from the connection nodes 705 of the second to fourth transistors 702 to 704. Eight odd circuits 1143 of the first local sub word line driving signal generation circuit 1140 may be provided to respectively output first local sub word line driving signals LPXID<1>, LPXID<3>, LPXID<5>, LPXID<7>, LPXID<9>, LPXID<11>, LPXID<13>, and LPXID<15> in response to the first sub word line driving signal MPXI<0:3> and the second sub word line driving signals PXID<1> and PXID<3>. The odd circuit 1143 of the first local sub word line driving signal generation circuit 1140 may activate any one of eight first local sub word line driving signals LPXID<1:15:2> to the logic high level in response to the logic low level of the activated first sub word line driving signal MPXI<0:3> and the activated second sub word line driving signals PXID<1> and PXID<3>. The first local sub word line driving signal LPXID<1:15:2> of the logic high level may have the voltage level of the high voltage VPP and may be provided to an odd circuit 1163 of the sub word line driving circuit 1160 connected to each of the plurality of memory blocks BLK1, BLK2, . . . , and BLKi.

As shown in FIG. 17, the first local sub word line driving signal generation circuit 1140 may be disposed in portions of the peripheral circuit structure PCS respectively corresponding to the plurality of memory blocks BLK1, BLK2, . . . , and BLKi. The first local sub word line driving signal generation circuit 1140 may include eight even circuits 1142 for respectively outputting the first local sub word line driving signals LPXID<0:14:2> in response to the first sub word line driving signal MPXI<0:3> and the second sub word line driving signals PXID<0> and PXID<2> and eight odd circuits 1143 for respectively outputting the first local sub word line driving signals LPXID<1:15:2> in response to the first sub word line driving signal MPXI<0:3> and the second sub word line driving signals PXID<1> and PXID<3>.

The second local sub word line driving signal generation circuit 1150 of FIG. 11 may include an even circuit 1152 and an odd circuit 1153 configured to generate the second local sub word line driving signal LPXIB<0:15> based on the first sub word line driving signal MPXI<0:3> provided by the first sub word line driving signal generation circuit 321 and the third sub word line driving signal PXIB<0:3> provided by the third sub word line driving signal generation circuit 1125.

Similar to the second local sub word line driving signal generation circuit 350 of FIG. 8, the even circuit 1152 of the second local sub word line driving signal generation circuit 1150 of FIG. 15A includes the first to sixth transistors 801 to 806 and third sub word line driving signals PXIB<0> and PXIB<2> are connected to gates of the third transistor 803 and the fifth transistor 805. However, unlike the second local sub word line driving signal generation circuit 350 of FIG. 8, in the even circuit 1152 of the second local sub word line driving signal generation circuit 1150 of FIG. 15A, a second local sub word line driving signal LPXIB<0:14:2> is output from the connection nodes 808 of the third to fifth transistors 803 to 805. Eight even circuits 1152 of the second local sub word line driving signal generation circuit 1150 may be provided to respectively output second local sub word line driving signals LPXIB<0>, LPXIB<2>, LPXIB<4>, LPXIB<6>, LPXIB<8>, LPXIB<10>, LPXIB<12>, and LPXIB<14> in response to the first sub word line driving signal MPXI<0:3> and the third sub word line driving signals PXIB<0> and PXIB<2>. The even circuit 1152 of the second local sub word line driving signal generation circuit 1150 may activate any one of eight first local sub word line driving signals LPXIB<0:14:2> to the logic low level in response to the logic low level of the activated first sub word line driving signal MPXI<0:3> and the logic high level of the activated third sub word line driving signals PXIB<0> and PXIB<2>. The second local sub word line driving signal LPXIB<0:14:2> of the logic low level may have the voltage level of the negative voltage VBB and may be provided to the sub word line driving circuit 360 connected to each of the plurality of memory blocks BLK1, BLK2, . . . , and BLKi.

Similar to the second local sub word line driving signal generation circuit 350 of FIG. 8, the odd circuit 1153 of the second local sub word line driving signal generation circuit 1150 of FIG. 15B includes the first to sixth transistors 801 to 806 and third sub word line driving signals PXIB<1> and PXIB<3> are connected to the gates of the third transistor 803 and the fifth transistor 805. However, unlike the second local sub word line driving signal generation circuit 350 of FIG. 8, in the odd circuit 1153 of the second local sub word line driving signal generation circuit 1150 of FIG. 15B, a second local sub word line driving signal LPXIB<1:15:2> is output from the connection nodes 808 of the third to fifth transistors 803 to 805. Eight odd circuits 1153 of the second local sub word line driving signal generation circuit 1150 may be provided to respectively output second local sub word line driving signals LPXIB<1>, LPXIB<3>, LPXIB<5>, LPXIB<7>, LPXIB<9>, LPXIB<11>, LPXIB<13>, and LPXIB<15> in response to the first sub word line driving signal MPXI<0:3> and the third sub word line driving signals PXIB<1> and PXIB<3>. The odd circuit 1153 of the second local sub word line driving signal generation circuit 1150 may activate any one of eight first local sub word line driving signals LPXIB<1:15:2> to the logic low level in response to the logic low level of the activated first sub word line driving signal MPXI<0:3> and the logic high level of the activated third sub word line driving signals PXIB<1> and PXIB<3>. The second local sub word line driving signal LPXIB<1:15:2> of the logic low level may have the voltage level of the negative voltage VBB and may be provided to the sub word line driving circuit 360 connected to each of the plurality of memory blocks BLK1, BLK2, . . . , and BLKi.

As shown in FIG. 17, the second local sub word line driving signal generation circuit 1150 may be disposed in portions of the peripheral circuit structure PCS respectively corresponding to the plurality of memory blocks BLK1, BLK2, . . . , and BLKi. The second local sub word line driving signal generation circuit 1150 may include eight even circuits 1152 for respectively outputting the second local sub word line driving signals LPXIB<0:14:2> in response to the first sub word line driving signal MPXI<0:3> and the third sub word line driving signals PXIB<0> and PXIB<2> and eight odd circuits 1153 for respectively outputting the first local sub word line driving signals LPXIB<1:15:2> in response to the first sub word line driving signal MPXI<0:3> and the third sub word line driving signals PXIB<1> and PXIB<3>.

The sub word line driving circuit 1160 of FIG. 11 may include the even circuit 1162 and the odd circuit 1163 configured to select one word line from among the word lines WL<0:1023> based on the local main word line driving signal LNWEIB<0:63> provided by the local main word line driving signal generation circuit 330, the first local sub word line driving signal LPXID<0:15> provided by the first local sub word line driving signal generation circuit 1140, and the second local sub word line driving signal LPXIB<0:15> provided by the second local sub word line driving signal generation circuit 1150 and drive a selected word line by using the high voltage VPP.

Similar to the sub word line driving circuit 360 of FIG. 9, the even circuit 1162 of the sub word line driving circuit 1160 of FIG. 16A includes the first to third transistors 901 to 903, a line of the first local sub word line driving signal LPXID<0:14:2> is connected to a source of the first transistor 901, a line of the second local sub word line driving signal LPXIB<0:14:2> is connected to a gate of the third transistor 903. However, unlike the sub word line driving circuit 360 of FIG. 9, in the even circuit 1162 of the sub word line driving circuit 1160 of FIG. 16A, even word lines WL<0:1022:2> are connected to the connection nodes 904 of the first to third transistors 901 to 903. 512 even circuits 1162 of the sub word line driving circuit 1160 may be provided to be respectively connected to even word lines WL<0>, WL<2>, . . . , and WL<1022> in response to the local main word line driving signal LNWEIB<0:63>, the first local sub word line driving signal LPXID<0:14:2>, and the second local sub word line driving signal LPXIB<0:14:2>. The even circuit 1162 of the sub word line driving circuit 1160 may select any one from among the 512 word lines WL<0:1022:2> in response to the logic low level of the activated local main word line driving signal LNWEIB<0:63>, the logic high level of the activated first local sub word line driving signal LPXID<0:14:2>, and the logic low level of the activated second local sub word line driving signal LPXIB<0:14:2> and activate a selected word line to the logic high level. A word line selected from among the word lines WL<0:1022:2> may be activated to the level of the high voltage VPP of the first local sub word line driving signal LPXID<0:14:2> of the logic high level.

Similar to the sub word line driving circuit 360 of FIG. 9, the odd circuit 1163 of the sub word line driving circuit 1160 of FIG. 16B includes the first to third transistors 901 to 903, a line of the first local sub word line driving signal LPXID<1:15:2> is connected to the source of the first transistor 901, a line of the second local sub word line driving signal LPXIB<1:15:2> is connected to the gate of the third transistor 903. However, unlike the sub word line driving circuit 360 of FIG. 9, in the odd circuit 1163 of the sub word line driving circuit 1160 of FIG. 16B, odd word lines WL<1:1023:2> are connected to the connection nodes 904 of the first to third transistors 901 to 903. 512 odd circuits 1163 of the sub word line driving circuit 1160 may be provided to be respectively connected to odd word lines WL<1>, WL<3>, . . . , and WL<1023> in response to the local main word line driving signal LNWEIB <0:63>, the first local sub word line driving signal LPXID<1:15:2>, and the second local sub word line driving signal LPXIB<1:15:2>. The odd circuit 1163 of the sub word line driving circuit 1160 may select any one from among the 512 word lines WL<1:1023:2> in response to the logic low level of the activated local main word line driving signal LNWEIB<0:63>, the logic high level of the activated first local sub word line driving signal LPXID<1:15:2>, and the logic low level of the activated second local sub word line driving signal LPXIB<1:15:2> and activate a selected word line to the logic high level. A word line selected from among the word lines WL<1:1023:2> may be activated to the level of the high voltage VPP of the first local sub word line driving signal LPXID<1:15:2> of the logic high level.

As shown in FIG. 17, sub word line driving circuits 1160 may be disposed in portions of the peripheral circuit structure PCS respectively corresponding to the plurality of memory blocks BLK1, BLK2, . . . , and BLKi. The sub word line driving circuit 1160 may include 512 even circuits 1162 for selecting any one from among 512 even word lines WL<0:1022:2> based on the local main word line driving signal LNWEIB<0:63>, the first local sub word line driving signal LPXID<0:14:2>, and the second local sub word line driving signal LPXIB<0:14:2> and activating a selected word line to the logic high level and 512 odd circuits 1163 for selecting any one from among 512 odd word lines WL<1:1023:2> based on the local main word line driving signal LNWEIB<0:63>, the first local sub word line driving signal LPXID<1:15:2>, and the second local sub word line driving signal LPXIB<1:15:2> and activating a selected word line to the logic high level.

Referring to FIG. 17, a region R2, which is a region of a portion of the peripheral circuit structure PCS corresponding to the first memory block BLK1 remaining after the local main word line driving signal generation circuit 330, the first local sub word line driving signal generation circuit 1140, the second local sub word line driving signal generation circuit 1150, and the sub word line driving circuit 1160 are arranged, is shown. Power lines (e.g., VPP, VSS, and VBB) of the memory device 10 may be arranged in the region R1 to stabilize power of the memory device 10, thereby improving the operation performance of the memory device 10. Furthermore, in the region R2, the first local sub word line driving signal generation circuit 1140, the second local sub word line driving signal generation circuit 1150, and the sub word line driving circuit 1160 corresponding to the first memory block BLK1 are divided into even circuits and odd circuits, and thus the region R2 may be relatively larger than the region R1. The number of power lines arranged in the region R2 may be greater than that of the region R1. Alternatively, power lines arranged in the region R2 may have a greater width than those the region R1. Therefore, the memory device 10 may improve operation performance thereof by using more stable power.

FIG. 18 is a diagram for describing the sense amplifier 120 according to embodiments.

Referring to FIGS. 1 and 18, the sense amplifier 120 may include a bit line sense amplifier circuit SA and a pre-charge and equalization circuit EQ. The bit line sense amplifier circuit SA may include a P-type sense amplifier PSA including PMOS transistors and an N-type sense amplifier NSA including NMOS transistors.

The P-type sense amplifier PSA includes a first PMOS transistor P11 and a second PMOS transistor P12 connected in series between the bit line BL and the complementary bit line BLB. A first sensing driving voltage line LA is connected to sources of the first PMOS transistor P11 and the second PMOS transistor P12, the complementary bit line BLB is connected to a gate of the first PMOS transistor P11, and the bit line BL is connected to the gate of the second PMOS transistor P12. The sizes of the first PMOS transistor P11 and the second PMOS transistor P12 may be the same as or different from each other, according to embodiments. A first sensing driving voltage is supplied through the first sensing driving voltage line LA, wherein the first sensing driving voltage of the bit line sense amplifier circuit SA may be the internal power voltage VINTA supplied to be used for the operation of the memory cell array 200 and may be a voltage generated by the voltage generating circuit 110 inside the memory device 10. The P-type sense amplifier PSA connected to the first sensing driving voltage line LA supplies a high level voltage that is amplified through a data sensing and amplifying operation of a memory cell connected to the bit line BL.

The N-type sense amplifier NSA includes a first NMOS transistor N11 and a second NMOS transistor N12 connected in series between the bit line BL and the complementary bit line BLB. A second sensing driving voltage line LAB is connected to sources of the first NMOS transistor N11 and the second NMOS transistor N12, the complementary bit line BLB is connected to a gate of the first NMOS transistor N11, and the bit line BL is connected to the gate of the second NMOS transistor N12. The sizes of the first NMOS transistor N11 and the second NMOS transistor N12 may be the same as or different from each other, according to embodiments. A second sensing driving voltage is supplied through the second sensing driving voltage line LAB, wherein the second sensing driving voltage of the bit line sense amplifier circuit SA may be the ground voltage VSS of the memory device 10. The N-type sense amplifier NSA connected to the second sensing driving voltage line LAB supplies a low level voltage that is amplified through a data sensing and amplifying operation of a memory cell connected to a bit line BL0.

The pre-charge and equalization circuit EQ equalizes the bit line BL and the complementary bit line BLB to the level of the bit line pre-charge voltage VEQ in response to an equalizing signal PEQ. The pre-charge and equalization circuit EQ includes a third NMOS transistor N13 connected between the bit line pre-charge voltage VEQ and the bit line BL, a fourth NMOS transistor N14 connected between the bit line pre-charge voltage VEQ and the complementary bit line BLB, and a fifth NMOS transistor N15 connected between the bit line BL and the complementary bit line BLB. According to some embodiments, the pre-charge and equalization circuit EQ may include any one of the third NMOS transistor N13 and the fourth NMOS transistor N14 and may include the fifth NMOS transistor N15.

Gates of third to fifth NMOS transistors N13 to N15 are connected to the equalizing signal PEQ. The equalizing signal PEQ may be provided from the control logic circuit based on a command provided to the memory device 10. The equalizing signal PEQ is applied at the logic high level during the pre-charging operation of the bit line sense amplifier circuit SA, turns on first to third NMOS transistors N13 to N15, and pre-charges the bit line BL and the complementary bit line BLB to the level of the bit line pre-charge voltage VEQ. During a sensing operation, the equalizing signal PEQ is applied at the logic low level and turns off the first to third NMOS transistors N13 to N15.

Figure 19:
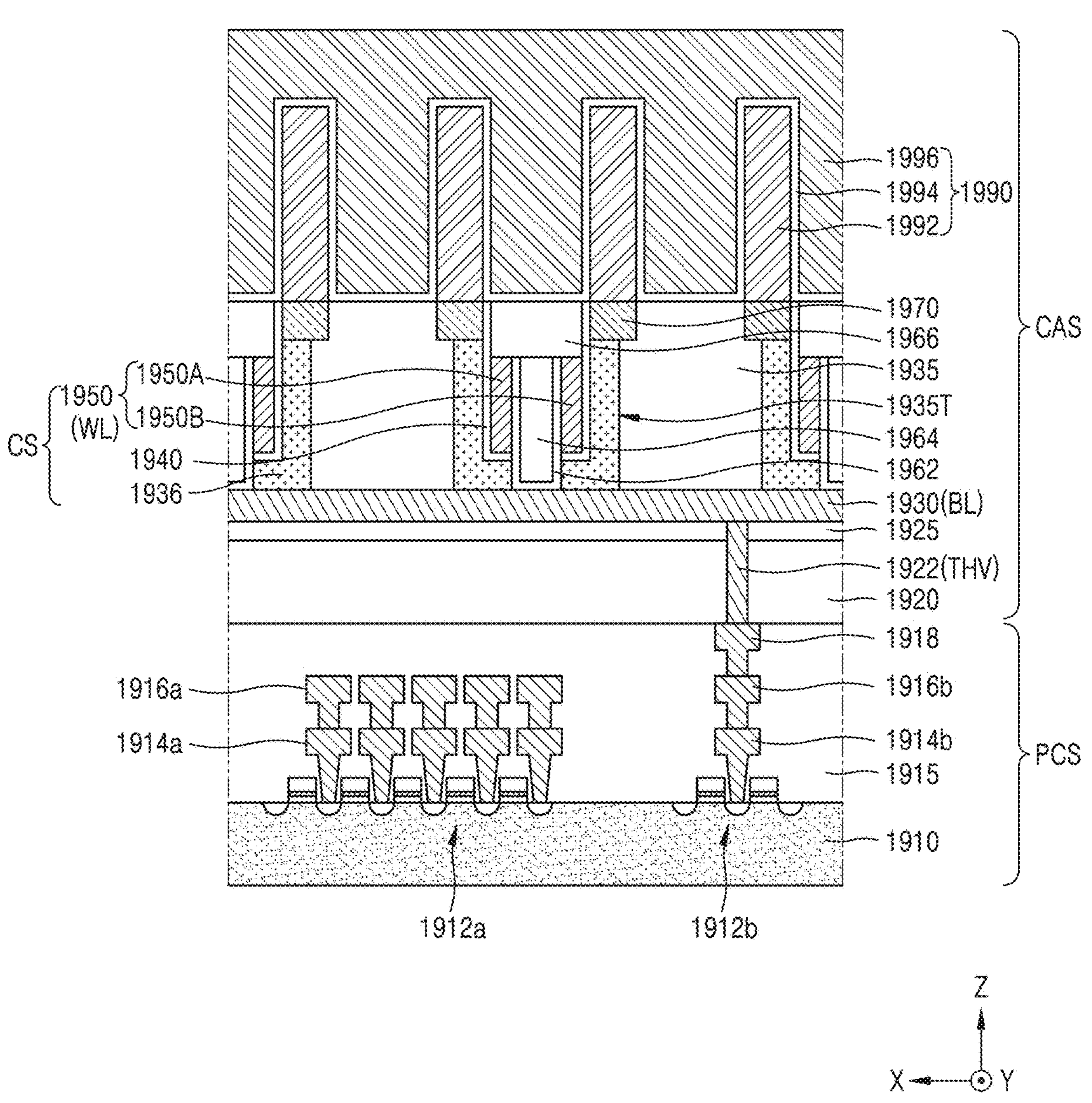
FIG. 19 is a diagram for describing the structure of a memory device according to embodiments.

FIG. 19 is a diagram for describing the structure of a memory device according to embodiments. FIG. 19 is a cross-sectional view taken along a line X1-X2 of FIG. 17.

Referring to FIGS. 1, 11, 17, and 19, the memory device 10 may include the cell array structure CAS and the peripheral circuit structure PCS overlapping each other in the vertical direction (Z direction). The cell array structure CAS may include the memory cell array 200. The peripheral circuit structure PCS may include the peripheral circuit 100. Therefore, the memory device 10 may have a structure in which the memory cell array 200 is disposed above the peripheral circuit 100, that is, a cell-over-periphery (COP) structure.

The cell array structure CAS may include the plurality of memory blocks BLK1, BLK2, . . . , and BLKi. The plurality of memory blocks BLK1, BLK2, . . . , and BLKi may each include a plurality of memory cells including vertical channel transistors. In the cell array structure CAS, a plurality of bit lines BL may extend in the first horizontal direction (X direction), and a plurality of word lines WL may extend in the second horizontal direction (Y direction).

The peripheral circuit structure PCS may include a semiconductor substrate, and the peripheral circuit 100 may be formed by forming semiconductor devices such as transistors and patterns for distributing devices on the semiconductor substrate. After the peripheral circuit 100 is formed in the peripheral circuit structure PCS, the cell array structure CAS including the memory cell array 200 may be formed, and patterns for electrically connecting the word lines WL and the bit lines BL of the memory cell array 200 to the peripheral circuit 100 formed in the peripheral circuit structure PCS may be formed.

Referring to FIG. 19, the peripheral circuit structure PCS may include a lower substrate 1910, an interlayer insulation layer 1915, a plurality of circuit elements 1912*a* and 1912*b* formed on the lower substrate 1910, first metal layers 1914*a* and 1914*b* respectively connected to the plurality of circuit elements 1912*a* and 1912*b*, second metal layers 1916*a* and 1916*b* formed on the first metal layers 1914*a* and 1914*b*, and a metal pattern 1918 formed on the uppermost metal layer of the peripheral circuit structure PCS. According to an embodiment, the first metal layers 1914*a* and 1914*b* may include tungsten having relatively high resistance, whereas the second metal layers 1916*a* and 1916*b* may include copper having relatively low resistance.

Although only the first metal layers 1914*a* and 1914*b* and the second metal layers 1916*a* and 1916*b* are shown and described in the present specification, the embodiment is not limited thereto, and one or more metal layers may be further formed on the second metal layers 1916*a* and 1916*b*. At least some of the one or more metal layers formed on the second metal layers 1916*a* and 1916*b* may include a material such as aluminum having a lower resistance than copper constituting the second metal layers 1916*a* and 1916*b*. The interlayer insulation layer 1915 is disposed on the lower substrate 1910 to cover the plurality of circuit elements 1912*a* and 1912*b*, the first metal layers 1914*a* and 1914*b*, and the second metal layers 1916*a* and 1916*b* and may include an insulation material such as a silicon oxide or a silicon nitride.

The plurality of circuit elements 1912*a* and 1912*b* may be connected to at least one of circuit elements constituting the peripheral circuit 100. For convenience of explanation, a first circuit element 1912*a* may be any one of transistors (e.g., 401 to 404, FIG. 4) included in the row decoders 130*a* and 130*b* described with reference to FIGS. 3 and 11, and a second circuit element 1912*b* may be any one of transistors P11 and N11 connected to the bit line BL in the sense amplifier 120 described with reference to FIG. 18.

The cell array structure CAS may include an upper substrate 1920, an inter-line insulation layer 1925, a conductive line 1930 on the inter-line insulation layer 1925, a via electrode 1922 under the conductive line 1930, a cell structure CS on the conductive line 1930, and a plurality of capacitor structures 1990 on the cell structure CS. The cell array structure CAS may include a plurality of conductive lines 1930, wherein the inter-line insulation layer 1925 may be formed to surround the bottom surfaces and side surfaces of each of the plurality of conductive lines 1930 and fill the space between the plurality of conductive lines 1930. The plurality of conductive lines 1930 may each extend in the first horizontal direction (X direction). The plurality of conductive lines 1930 may be spaced apart from one another in the second horizontal direction (Y direction) perpendicular to the first horizontal direction (X direction) and each extend in the first horizontal direction (X direction). The via electrode 1922 is formed to penetrate through the upper substrate 1920 and extend in the vertical direction (Z direction) to the metal pattern 1918 of the peripheral circuit structure PCS and may electrically connect the conductive line 1930 to the second circuit element 1912*b* of the sense amplifier 120. The conductive line 1930 may function as the bit line BL of the memory device 10.

A separation insulation layer 1935 may be formed on the conductive line 1930. The isolation insulation layer 1935 may include a channel trench 1935T extending long in the first horizontal direction (X direction), and a plurality of insulation patterns spaced apart from one another by the channel trench 1935T may be formed. A channel layer 1936 may be formed in the channel trench 1935T. The channel layer 1936 may extend alongside surfaces and the bottom surface of the channel trench 1935T and be electrically connected to the conductive line 1930. A gate dielectric layer 1940 may be formed on the channel layer 1936 in the channel trench 1935T. A gate dielectric layer 1940 may be provided between the channel layer 1936 and a gate electrode 1950. The gate electrode 1950 may be formed on the gate dielectric layer 1940 in the channel trench 1935T. According to some embodiments, the gate electrode 1950 may include a first gate electrode 1950A and a second gate electrode 1950B facing each other within one channel trench 1935T. In this case, a two transistor structures may be implemented per one channel layer 1936. The first gate electrode 1950A may function as a first word line of the memory cell array 200, and the second gate electrode 1950B may function as a second word line of the memory cell array 200.

According to some embodiments, a barrier insulation layer 1962 and a gap-fill insulation layer 1964 may be formed between the first gate electrode 1950A and the second gate electrode 1950B. The first gate electrode 1950A and the second gate electrode 1950B may be separated from each other by the barrier insulation layer 1962 and the gap-fill insulation layer 1964. A gap-fill insulation layer 1964 may be formed on the barrier insulation layer 1962 to fill a region between the first gate electrode 1950A and the second gate electrode 1950B.

The cell structure CS may include a plurality of vertical channel transistor structures. A vertical channel transistor may refer to a structure in which a channel length of the channel layer 1936 extends in the vertical direction (Z direction) perpendicular to the top surface of the upper substrate 1920. The vertical channel transistor may include the channel layer 1936, the gate electrode 1950, and the gate dielectric layer 1940 provided between the channel layer 1936 and the first gate electrode 1950A. The channel layer 1936 of the vertical channel transistor may include a first source/drain region and a second source/drain region arranged in the vertical direction (Z direction). For example, a lower portion of the channel layer 1936 may function as the first source/drain region, and an upper portion of the channel layer 1936 may function as the second source/drain region. A portion of the channel layer 1936 between the first source/drain region and the second source/drain region may function as a channel region.

A contact layer 1970 may be formed on the channel layer 1936 and connected to the top surface of the channel layer 1936. The contact layer 1970 may interconnect the channel layer 1936 and the capacitor structures 1990. The top surface of the channel layer 1936 adjacent to the first gate electrode 1950A may be connected to one contact layer 1970, and the top surface of the channel layer 1936 adjacent to the second gate electrode 1950B may be connected to another contact layer 1970.

A capacitor structure 1990 may be formed on the separation insulation layer 1935 and the contact layer 1970. The capacitor structure 1990 may be connected to the top surface of the contact layer 1970. The capacitor structure 1990 may be controlled by the conductive line 1930 and the gate electrode 1950 to store data. The capacitor structure 1990 may include a lower electrode 1992, a capacitor dielectric layer 1994, and an upper electrode 1996. The capacitor structure 1990 may store charges in the capacitor dielectric layer 1994 by using a potential difference generated between the lower electrode 1992 and the upper electrode 1996.

One of the plurality of vertical channel transistor structures and one of the plurality of capacitor structures 1990 may constitute the memory cell MC (FIG. 18), and thus the cell array structure CAS may include a plurality of memory cells MC including a plurality of cell structures CS and a plurality of capacitor structures 1990.

Figure 20:
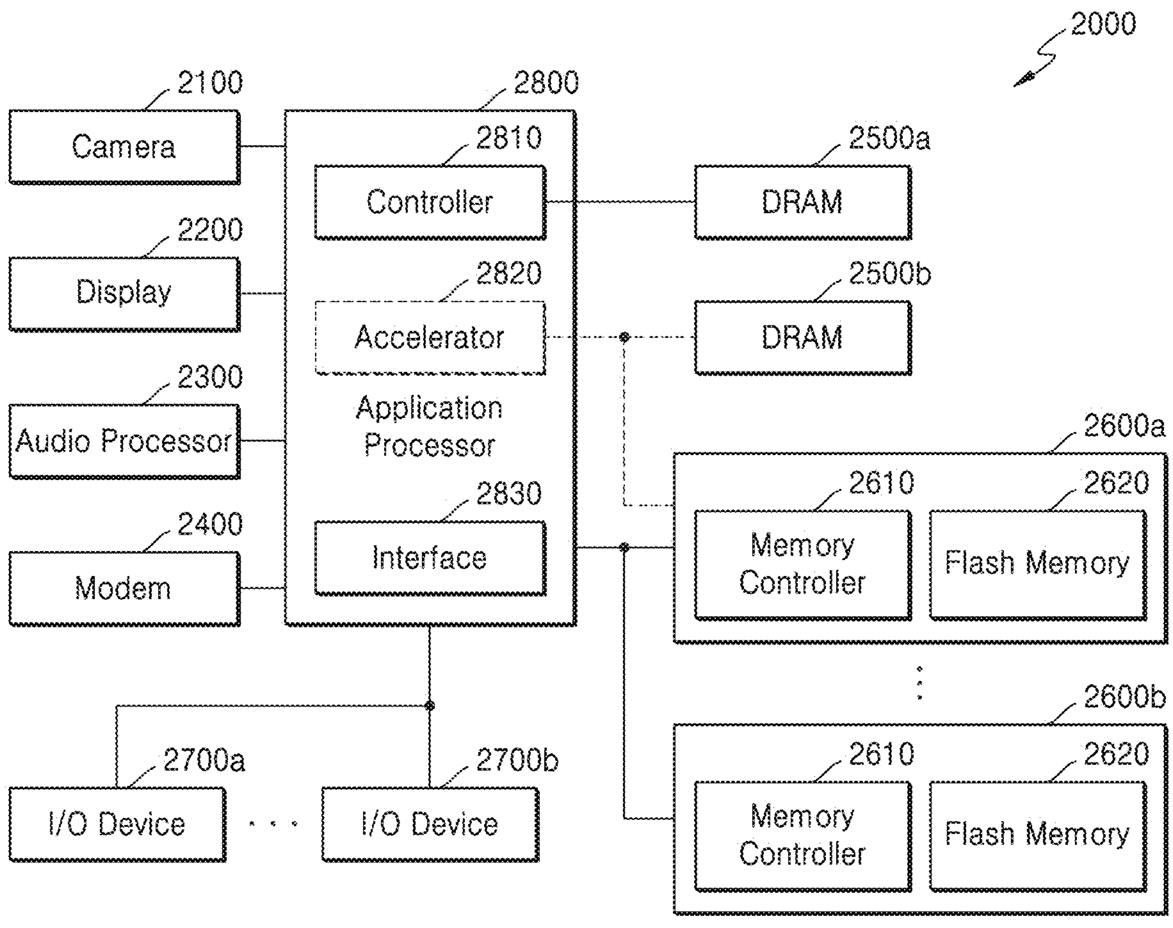
FIG. 20 is a block diagram of a system for describing an electronic device including a memory device according to embodiments.

FIG. 20 is a block diagram of a system 2000 for describing an electronic device including a memory device according to embodiments.

Referring to FIG. 20, the system 2000 may include a camera 2100, a display 2200, an audio processor 2300, a modem 2400, DRAMs 2500*a* and 2500*b*, flash memories 2600*a* and 2600*b*, I/O devices 2700*a* and 2700*b*, and an application processor (hereinafter referred to as an "AP") 2800. The system 2000 may be implemented as a laptop computer, a mobile phone, a smartphone, a tablet PC, a wearable device, a healthcare device, or an Internet-of-Things) device. Also, the system 2000 may be implemented as a server or a PC.

The camera 2100 may capture a still image or a video according to a user's control and may store captured image/video data or transmit the captured image/video data to the display 2200. The audio processor 2300 may process audio data included in the flash memories 2600*a* and 2600*b* or network content. The modem 2400 may transmit a modulated signal for wired/wireless data transmission/reception to a receiver and the modulated signal may be demodulated by the receiver to restore an original signal. The I/O devices 2700*a* and 2700*b* may include devices providing a digital input function and/or digital output function, e.g., a Universal Serial Bus (USB), a storage, a digital camera, a Secure Digital (SD) card, a Digital Versatile Disc (DVD), a network adapter, a touch screen, etc.

The AP 2800 may control the overall operation of the system 2000. The AP 2800 may include a control block 2810, an accelerator block or accelerator chip 2820, and an interface block 2830. The AP 2800 may control the display 2200, such that a part of content stored in the flash memories 2600*a* and 2600*b* is displayed on the display 2200. When a user input is received through the I/O devices 2700*a* and 2700*b*, the AP 2800 may perform a control operation corresponding to the user input. The AP 2800 may include an accelerator block, which is a circuit dedicated for calculation of Artificial Intelligence (AI) data, or may include an accelerator chip 2820 separately from the AP 2800. The DRAM 2500*b* may be additionally provided in the accelerator block or the accelerator chip 2820. The accelerator block is a functional block that specializes in performing a particular function of the AP 2800 and may include a GPU, which is a functional block that specializes in processing graphic data, a neural processing unit (NPU), which is a block that specializes in AI calculation and inference, and a data processing unit (DPU), which is a block that specializes in data transmission.

The system 2000 may include a plurality of DRAMs 2500*a* and 2500*b*. The AP 2800 may set up a DRAM interface protocol and communicate with the DRAMs 2500*a* and 2500*b* to control the DRAMs 2500*a* and 2500*b* through commands complying with the Joint Electron Device Engineering Council (JEDEC) standard and mode register (MRS) setting or to use company-specific functions such as low voltage/high-speed/reliability and a cyclic redundancy check (CRC)/error correction code (ECC) function. For example, the AP 2800 may communicate with the DRAM 2500*a* through an interface complying with the JEDEC standards such as LPDDR4 and LPDDR5, and the accelerator block or the accelerator chip 2820 may set and use a new DRAM interface protocol to control the DRAM 2500*b* for an accelerator, which has a greater bandwidth than the DRAM 2500*a*.

Although FIG. 20 shows only the DRAMs 2500*a* and 2500*b*, the embodiment is not limited thereto. As long as a bandwidth, a response speed, and voltage conditions of the AP 2800 or the accelerator chip 2820 are satisfied, any memory such as a PRAM, an SRAM, an MRAM, an RRAM, an FRAM, or a Hybrid RAM may be used. The DRAMs 2500*a* and 2500*b* have relatively smaller latency and bandwidth than the I/O devices 2700*a* and 2700*b* or the flash memories 2600*a* and 2600*b*. The DRAMs 2500*a* and 2500*b* are initialized when the system 2000 is powered on and the OS and application data are loaded thereto, and thus the DRAMs 2500*a* and 2500*b* may be used as temporary storages for the OS and the application data or may be used as execution spaces for various software code.

In the DRAMs 2500*a* and 2500*b*, four arithmetic operations (i.e., addition, subtraction, multiplication, and division), vector calculations, address calculations, or Fast Fourier Transform (FFT) calculations may be performed. Also, in the DRAMs 2500*a* and 2500*b*, a function for an operation used for an inference may be performed. Here, the inference may be performed in a deep learning algorithm using an artificial neural network. The deep learning algorithm may include a training operation for learning a model through various data and an inference operation for recognizing data with the trained model. According to an embodiment, an image captured by a user through the camera 2100 is signal-processed and stored in the DRAM 2500*b*, and the accelerator block or accelerator chip 2820 may perform AI data calculation for recognizing data using data stored in the DRAM 2500*b* and a function used for inference.

The system 2000 may include a plurality of storages or flash memories 2600*a* and 2600*b* having a larger capacity than the DRAMs 2500*a* and 2500*b*. The accelerator block or accelerator chip 2820 may perform a training operation and an AI data calculation using the flash memories 2600*a* and 2600*b*. According to an embodiment, the flash memories 2600*a* and 2600*b* may include a memory controller 2610 and a flash memory device 2620, and a training operation and an inference AI data calculation performed by the AP 2800 and/or the accelerator chip 2820 may be performed more efficiently by using an arithmetic unit included in the memory controller 2610. The flash memories 2600*a* and 2600*b* may store images captured through the camera 2100 or data transmitted through a data network. For example, the flash memories 2600*a* and 2600*b* may store Augmented Reality/Virtual Reality content, High Definition (HD) content, or Ultra High Definition (UHD) content.

In the system 2000, the DRAMs 2500*a* and 2500*b* may include the memory device described above with reference to FIGS. 1 to 19. The memory device may include a peripheral circuit structure formed on a semiconductor substrate and a cell array structure vertically overlapping the peripheral circuit structure on the peripheral circuit structure. The cell array structure may include a plurality of memory blocks in a memory cell region in which a plurality of vertical channel transistor structures and a plurality of capacitor structures respectively connected to the vertical channel transistor structures are formed. The peripheral circuit structure includes a row decoder connected to a plurality of word lines of each of the plurality of memory blocks, and the row decoder may be divided into a first circuit group commonly connected to the plurality of memory blocks and a second circuit group connected to each of the plurality of memory blocks. The first circuit group may include a main word line driving signal generation circuit for generating first main word line driving signals and second main word line driving signals based on signals of a more significant bit group from among row address signals and a sub word line driving signal generation circuit for generating first sub word line driving signals, second sub word line driving signals, and third sub word line driving signals based on signals of a less significant bit group from among the row address signals. The second circuit group may include a local main word line driving signal generation circuit for generating local main word line driving signals based on first main word line driving signals and second main word line driving signals, a first local sub word line driving signal generation circuit for generating first local sub word line driving signals based on first word line driving signals and second sub word line driving signals, a second local sub word line driving signal generation circuit for generating second local sub word line driving signals based on the first sub word line driving signals and third sub word line driving signals, and a sub word line driving circuit for activating one word line from among a plurality of word lines of a memory block selected from among the plurality of memory blocks based on the local main word line driving signals, the first local sub word line driving signals, and the second local sub word line driving signals. In the memory device, as a row decoder circuit is divided and arranged in the peripheral circuit structure, the area occupied by the row decoder circuit may be reduced, thereby reducing the chip size of the memory device. Also, by reducing the number of conductive lines connected to the divided row decoder circuit and arranging power lines in an area secured by reducing the number of the conductive lines, the power supply of the memory device may be stabilized, thereby improving operation performance of the memory device.

While the disclosure has been particularly shown and described with reference to embodiments thereof, it will be understood that various changes in form and details may be made therein without departing from the spirit and scope of the following claims.

What is claimed is:

1. A memory device comprising:

a peripheral circuit structure; and a cell array structure provided on the peripheral circuit structure and overlapping the peripheral circuit structure in a vertical direction, wherein the cell array structure comprises a plurality of memory blocks arranged in a first horizontal direction, at least one of the plurality of memory blocks comprising:

a memory cell region comprising a plurality of word lines extending in the first horizontal direction and a plurality of bit lines extending in a second horizontal direction perpendicularly crossing the first horizontal direction, wherein the peripheral circuit structure comprises a row decoder connected to the plurality of word lines of each of the plurality of memory blocks, and the row decoder comprises:

a first circuit group configured to generate main word line driving signals and sub word line driving signals, the first circuit group being commonly connected to the plurality of memory blocks; and a second circuit group respectively connected to the plurality of memory blocks and configured to generate local main word line driving signals and local sub word line driving signals and activate one word line from among a plurality of word lines of a memory block selected from among the plurality of memory blocks, wherein row address signals of the row decoder are classified into a more significant bit group and a less significant bit group, and wherein the first circuit group comprises:

a main word line driving signal generation circuit configured to generate first main word line driving signals and second main word line driving signals based on the row address signals that belong to the more significant bit group, wherein the main word line driving signals comprise the first main word line driving signals and the second main word line driving signals; and a sub word line driving signal generation circuit configured to generate first sub word line driving signals, second sub word line driving signals, and third sub word line driving signals based on the row address signals that belong to the less significant bit group among the row address signals, wherein the sub word line driving signals comprise the first sub word line driving signals, the second sub word line driving signals, and the third sub word line driving signals.

2. The memory device of claim 1, wherein the main word line driving signal generation circuit comprises:

a first main word line driving signal generation circuit configured to generate the first main word line driving signals based on at least one signal among the row address signals that belong to the more significant bit group; and a second main word line driving signal generation circuit configured to generate the second main word line driving signals based on at least one other signal among the row address signals that belong to the more significant bit group.

3. The memory device of claim 1, wherein the sub word line driving signal generation circuit comprises:

a first sub word line driving signal generation circuit configured to generate the first sub word line driving signals based on at least one signal among the row address signals that belong to the less significant bit group;

a second sub word line driving signal generation circuit configured to generate the second sub word line driving signals based on at least one other signal among the row address signals that belong to the less significant bit group; and a third sub word line driving signal generation circuit configured to generate the third sub word line driving signals based on the at least one other signal among the row address signals that belong to the less significant bit group.

4. The memory device of claim 1, wherein the second circuit group comprises:

a local main word line driving signal generation circuit configured to generate local main word line driving signals based on the first main word line driving signals and the second main word line driving signals;

a first local sub word line driving signal generation circuit configured to generate first local sub word line driving signals based on the first sub word line driving signals and the second sub word line driving signals;

a second local sub word line driving signal generation circuit configured to generate second local sub word line driving signals based on the first sub word line driving signals and the third sub word line driving signals; and a sub word line driving circuit configured to activate one word line from among the plurality of word lines of the selected memory block based on the local main word line driving signals, the first local sub word line driving signals, and the second local sub word line driving signals.

5. The memory device of claim 4, wherein the local main word line driving signal generation circuit comprises a NAND logic circuit configured to input the first main word line driving signals and the second main word line driving signals, and the NAND logic circuit is connected to a high voltage line and a negative voltage line of the memory device.

6. The memory device of claim 4, wherein the first local sub word line driving signal generation circuit comprises a NOR logic circuit configured to input the first sub word line driving signals and the second sub word line driving signals, and the NOR logic circuit is connected to a high voltage line and a negative voltage line of the memory device.

7. The memory device of claim 4, wherein the second local sub word line driving signal generation circuit comprises:

inverter circuits configured to respectively input the first sub word line driving signals; and a NAND logic circuit configured to input output signals of the inverter circuits and the third sub word line driving signals, and connected to a high voltage line and a negative voltage line of the memory device.

8. The memory device of claim 4, wherein the sub word line driving circuit comprises:

first P-type metal oxide semiconductor (PMOS) transistors, wherein sources of the first PMOS transistors are respectively connected to the first local sub word line driving signals and gates of the first PMOS transistors are respectively connected to the local main word line driving signals;

first N-type metal oxide semiconductor (NMOS) transistors, wherein sources of the first NMOS transistors are connected to a negative voltage line of the memory device and gates of the first NMOS transistors are respectively connected to the local main word line driving signals; and second NMOS transistors, wherein sources of the second NMOS transistors are connected to the negative voltage line and gates of the second NMOS transistors are respectively connected to the second local sub word line driving signals, and wherein the plurality of word lines is connected to drains of the first PMOS transistors and drains of the first and second NMOS transistors, respectively.

9. A memory device comprising:

a peripheral circuit structure; and a cell array structure provided on the peripheral circuit structure and overlapping the peripheral circuit structure in a vertical direction, wherein the cell array structure comprises a plurality of memory blocks arranged in a first horizontal direction, at least one of the plurality of memory blocks comprising:

a memory cell region comprising a plurality of word lines extending in the first horizontal direction and a plurality of bit lines extending in a second horizontal direction perpendicularly crossing the first horizontal direction, wherein the peripheral circuit structure comprises a row decoder connected to even word lines and odd word lines of the plurality of word lines of the plurality of memory blocks, and the row decoder comprises:

a first circuit group commonly connected to the plurality of memory blocks and configured to generate main word line driving signals and sub word line driving signals associated with the even word lines and the odd word lines based on row address signals; and a second circuit group respectively connected to the plurality of memory blocks and configured to generate local main word line driving signals and local sub word line driving signals associated with the even word lines and the odd word lines based on the row address signals and activate one word line from among the even word lines and the odd word lines of a memory block selected from among the plurality of memory blocks, wherein the row address signals of the row decoder are classified into a more significant bit group and a less significant bit group, and wherein the first circuit group comprises:

a main word line driving signal generation circuit configured to generate first main word line driving signals and second main word line driving signals based on the row address signals that belong to the more significant bit group, wherein the main word line driving signals comprise the first main word line driving signals and the second main word line driving signals; and a sub word line driving signal generation circuit configured to generate first sub word line driving signals, second sub word line driving signals, and third sub word line driving signals based on the row address signals that belong to the less significant bit group, wherein the sub word line driving signals comprise the first sub word line driving signals, the second sub word line driving signals, and the third sub word line driving signals.

10. The memory device of claim 9, wherein the main word line driving signal generation circuit comprises:

a first main word line driving signal generation circuit configured to generate the first main word line driving signals based on at least one signal among the row address signals that belong to the more significant bit group; and a second main word line driving signal generation circuit configured to generate the second main word line driving signals based on at least one other signal among the row address signals that belong to the more significant bit group.

11. The memory device of claim 9, wherein the sub word line driving signal generation circuit comprises:

a first sub word line driving signal generation circuit configured to generate the first sub word line driving signals based on at least one signal among the row address signals that belong to the less significant bit group;

a second sub word line driving signal generation circuit configured to generate the second sub word line driving signals based on at least one other signal among the row address signals that belong to the less significant bit group, wherein the second sub word line driving signals are divided into signals associated with the even word lines and signals associated with the odd word lines; and a third sub word line driving signal generation circuit configured to generate the third sub word line driving signals based on the at least one other signal among the row address signals that belong to the less significant bit group, wherein the third sub word line driving signals are divided into signals associated with the even word lines and signals associated with the odd word lines.

12. The memory device of claim 9, wherein the second circuit group comprises:

a local main word line driving signal generation circuit configured to generate local main word line driving signals based on the first main word line driving signals and the second main word line driving signals;

a first local sub word line driving signal generation circuit configured to generate first local sub word line driving signals based on the first sub word line driving signals and the second sub word line driving signals;

a second local sub word line driving signal generation circuit configured to generate second local sub word line driving signals based on the first sub word line driving signals and the third sub word line driving signals; and a sub word line driving circuit configured to activate one word line from among the plurality of word lines of the selected memory block based on the local main word line driving signals, the first local sub word line driving signals, and the second local sub word line driving signals.

13. The memory device of claim 12, wherein the local main word line driving signal generation circuit comprises a NAND logic circuit configured to input the first main word line driving signals and the second main word line driving signals, and the NAND logic circuit is connected to a high voltage line and a negative voltage line of the memory device.

14. The memory device of claim 12, wherein the first local sub word line driving signal generation circuit comprises a NOR logic circuit configured to input the first sub word line driving signals and the second sub word line driving signals, and the NOR logic circuit is connected to a high voltage line and a negative voltage line of the memory device.

15. The memory device of claim 12, wherein the second local sub word line driving signal generation circuit comprises:

inverter circuits configured to respectively input the first sub word line driving signals; and a NAND logic circuit configured to input output signals of the inverter circuits and the third sub word line driving signals, and connected to a high voltage line and a negative voltage line of the memory device.

16. The memory device of claim 12, wherein the sub word line driving circuit comprises:

first P-type metal oxide semiconductor (PMOS) transistors, wherein sources of the first PMOS transistors are respectively connected to the first local sub word line driving signals and gates of the first PMOS transistors are respectively connected to the local main word line driving signals;

first N-type metal oxide semiconductor (NMOS) transistors, wherein sources of the first NMOS transistors are connected to a negative voltage line of the memory device and gates of the first NMOS transistors are respectively connected to the local main word line driving signals; and second NMOS transistors, wherein sources of the second NMOS transistors are connected to the negative voltage line and gates of the second NMOS transistors are respectively connected to the second local sub word line driving signals, and wherein the plurality of word lines is connected to drains of the first PMOS transistors and drains of the first and second NMOS transistors, respectively.

17. A memory device comprising:

a memory cell array comprising a plurality of memory cells connected to a plurality of word lines, wherein the memory cell array comprises a plurality of memory blocks; and a row decoder connected to the plurality of word lines of the plurality of memory blocks, wherein the row decoder comprises:

a first circuit group commonly connected to the plurality of memory blocks, and configured to generate main word line driving signals and sub word line driving signals based on row address signals;

wherein the row address signals of the row decoder are classified into a more significant bit group and a less significant bit group, and wherein the first circuit group comprises:

a main word line driving signal generation circuit configured to generate first main word line driving signals and second main word line driving signals based on the row address signals that belong to the more significant bit group, wherein the main word line driving signals comprise the first main word line driving signals and the second main word line driving signals; and a sub word line driving signal generation circuit configured to generate first sub word line driving signals, second sub word line driving signals, and third sub word line driving signals based on the row address signals that belong to the less significant bit group, wherein the sub word line driving signals comprise the first sub word line driving signals, the second sub word line driving signals, and the third sub word line driving signals; and a second circuit group respectively connected to the plurality of memory blocks and configured to generate local main word line driving signals and local sub word line driving signals based on the row address signals and activate one word line from among the plurality of word lines of a memory block selected from among the plurality of memory blocks.

18. The memory device of claim 17, wherein the row decoder generates the sub word line driving signals and the local sub word line driving signals as signals associated with even word lines of the plurality of word lines and signals associated with odd word lines of the plurality of word lines and activates one word line from among the even word lines and the odd word lines of the selected memory block.

* * * * *